United States Patent
Dziomkina et al.

(10) Patent No.: US 8,823,919 B2
(45) Date of Patent: Sep. 2, 2014

(54) LITHOGRAPHIC APPARATUS, REMOVABLE MEMBER AND DEVICE MANUFACTURING METHOD

(75) Inventors: Nina Vladimirovna Dziomkina, Eindhoven (NL); Roelof Frederik De Graaf, Veldhoven (NL); Marcus Adrianus Van De Kerkhof, Helmond (NL); Martinus Hendrikus Antonius Leenders, Rhoon (NL); Paulus Martinus Maria Liebregts, Veldhoven (NL); Gerardus Martinus Antonius De Rooij, Tilburg (NL); Martijn Houben, 's-Hertogenbosch (NL); Vijay Kumar Badam, Eindhoven (NL); Johanna Antoinette Maria Sondag-Huethorst, Valkenswaard (NL); Niek Elout De Kruijf, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 262 days.

(21) Appl. No.: 12/946,566

(22) Filed: Nov. 15, 2010

(65) Prior Publication Data

US 2011/0116060 A1   May 19, 2011

Related U.S. Application Data

(60) Provisional application No. 61/261,871, filed on Nov. 17, 2009, provisional application No. 61/360,856, filed on Jul. 1, 2010.

(51) Int. Cl.
*G03B 27/52* (2006.01)
*B32B 7/12* (2006.01)
*G03F 7/20* (2006.01)
*C09J 7/02* (2006.01)
*C09J 7/04* (2006.01)

(52) U.S. Cl.
CPC ........ *G03F 7/70916* (2013.01); *G03F 7/70341* (2013.01); *G03F 7/7095* (2013.01); *C09J 7/0217* (2013.01); *B32B 2307/71* (2013.01); *B32B 2307/73* (2013.01); *B32B 2405/00* (2013.01)
USPC ............. 355/30; 428/343; 428/353; 428/354; 428/355 R

(58) Field of Classification Search
CPC ............ G03F 7/70341; G03F 7/70808; G03F 7/7095; G03F 7/70916; B32B 2307/71; B32B 2307/73; B32B 2405/00; C09J 7/0217
USPC ...................... 355/30, 53, 72; 428/343–355 N
See application file for complete search history.

(56) References Cited

U.S. PATENT DOCUMENTS

| 4,509,852 A | 4/1985 | Tabarelli |
| 7,684,010 B2 | 3/2010 | Smulders et al. |

(Continued)

FOREIGN PATENT DOCUMENTS

| EP | 1 420 300 | 5/2004 |
| JP | 7-285044 | 10/1995 |

(Continued)

OTHER PUBLICATIONS

Japanese Office Action mailed May 2, 2012 in corresponding Japanese Patent Application No. 2010-251364.

*Primary Examiner* — Steven H Whitesell Gordon
(74) *Attorney, Agent, or Firm* — Pillsbury Winthrop Shaw Pittman LLP

(57) ABSTRACT

A member is provided to prevent immersion liquid ingress to a gap between components or to adhere to at least one component to provide a surface to a feature of an immersion system. The member has a plastic sealing portion that is adhered to the component(s). The plastic sealing portion is opaque to DUV radiation. It may be resistant to degradation through exposure to DUV radiation. It may have a liquid phobic coating or property.

20 Claims, 15 Drawing Sheets

(56) References Cited

U.S. PATENT DOCUMENTS

| | | | |
|---|---|---|---|
| 8,659,741 B2* | 2/2014 | De Graaf et al. ............... 355/30 |
| 2002/0071978 A1* | 6/2002 | Bekkedahl et al. ............. 429/25 |
| 2004/0126597 A1* | 7/2004 | Cohen et al. .................. 428/458 |
| 2004/0136494 A1 | 7/2004 | Lof |
| 2004/0207824 A1 | 10/2004 | Lof |
| 2006/0038968 A1 | 2/2006 | Kemper |
| 2006/0119809 A1 | 6/2006 | Verhagen |
| 2006/0119817 A1 | 6/2006 | Hennus et al. |
| 2006/0158627 A1 | 7/2006 | Kemper |
| 2006/0203215 A1* | 9/2006 | Hendrik Smulders et al. . 355/53 |
| 2008/0212046 A1 | 9/2008 | Riepen |
| 2009/0059192 A1 | 3/2009 | Beckers et al. |
| 2009/0206304 A1 | 8/2009 | Dziomkina |
| 2010/0060868 A1 | 3/2010 | Tanasa |
| 2010/0110410 A1 | 5/2010 | Steffens et al. |
| 2010/0279232 A1 | 11/2010 | Dziomkina et al. |
| 2011/0135839 A1 | 6/2011 | Dziomkina |
| 2011/0199592 A1 | 8/2011 | De Graff et al. |

FOREIGN PATENT DOCUMENTS

| | | |
|---|---|---|
| JP | 9-114098 | 5/1997 |
| JP | 9-311436 | 12/1997 |
| JP | 2001-255441 | 9/2001 |
| JP | 2002-202584 | 7/2002 |
| JP | 2006-200562 | 8/2006 |
| JP | 2006-253688 | 9/2006 |
| JP | 2010-109367 | 5/2010 |
| JP | 2011-109092 | 6/2011 |
| WO | WO 99/49504 | 9/1999 |
| WO | WO 2005/064405 | 7/2005 |

* cited by examiner

LITHOGRAPHIC APPARATUS, REMOVABLE MEMBER AND DEVICE MANUFACTURING METHOD

This application claims priority and benefit under 35 U.S.C. §119(e) to U.S. Provisional Patent Application No. 61/261,871, entitled "Lithographic Apparatus, Removable Member and Device Manufacturing Method", filed on Nov. 17, 2009 and to U.S. Provisional Patent Application No. 61/360,856, entitled "Lithographic Apparatus, Removable Member and Device Manufacturing Method", filed on Jul. 1, 2010. The content of each of the foregoing applications is incorporated herein in its entirety by reference.

FIELD

The present invention relates to a lithographic apparatus, a removable member, and a method for applying a removable member to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include a stepper and a scanner. In a stepper each target portion is irradiated by exposing an entire pattern onto the target portion at one time. In a scanner each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

Another arrangement proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504. This type of arrangement may be referred to as a localized immersion system.

Another arrangement is an all wet arrangement in which the immersion liquid is unconfined as disclosed in PCT Patent Application Publication No. WO 2005/064405. In such a system the immersion liquid is unconfined. The whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States Patent Application Publication No. US 2006/0119809. A member is provided which covers the substrate in all positions and which is arranged to have immersion liquid extending between it and the top surface of the substrate and/or substrate table which holds the substrate.

In European Patent Application Publication No. EP 1420300 and United States Patent Application Publication No. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table may be moved away from its exposure position to a position in which the substrate may be removed and replaced by a different substrate. This is known as substrate swap. In a two stage lithographic apparatus, a swap of the tables may take place under the projection system.

In an immersion apparatus, immersion fluid is handled by a fluid handling system or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of fluid (such as gas), for example to help in handling liquid, e.g. in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. The fluid handling system may be located between the projection system and the substrate table. In reference to the aforementioned description, reference in this paragraph to a feature defined with respect to fluid may be understood to include a feature defined with respect to liquid, if the context is deemed appropriate.

SUMMARY

In an immersion lithographic apparatus, a removable member, such as a surface member or sealing member, may be located on a surface to modify a surface property of the underlying surface, for example, in a non-limiting list, to bridge a gap, to provide a surface with a desired contact angle, or to repair the contact angle of surface. However, like all surfaces in an immersion system of a lithographic tool, the surface of the removable member may deteriorate under the influence of the immersion liquid, the exposure radiation, deep ultraviolet (DUV) radiation, or both. Deterioration of the removable member may reduce the lifetime of the removable member so that it may need to more quickly replaced.

It is desirable, for example, to provide a removable member in which the deterioration of the removable member is suppressed if not prevented.

According to an aspect, there is provided a surface member for removable application to cover at least a part of at least one surface of an immersion lithographic apparatus, the member having two major orthogonal dimensions and comprising:

a covering portion having a first surface and a second surface; and an adhesive on the second surface to attach the member to a surface of an immersion lithographic apparatus, wherein the covering portion comprises a plastic material or polymer and the covering portion is opaque to DUV radiation.

According to an aspect, there is provided a surface member for removable application to cover at least a part of a surface, the member having two major orthogonal dimensions and comprising:

a first metal layer;

a second metal layer;

a layer of plastic material or polymer positioned between the first metal layer and the second metal layer; and an adhesive on the second metal layer to attach the member to the surface.

According to an aspect, there is provided a method of manufacturing a surface member, the surface member being for removable application to cover at least a part of a surface, the method comprising the steps of:

applying a stabilizing layer to a layer of plastic material or polymer;

applying a transmission reduction layer to the plastic material or polymer layer such that the stabilizing layer and the transmission reduction layer are applied to opposite sides of the plastic material or polymer layer; and applying an adhesive to the stabilizing layer, the adhesive being applied to the opposite side of the stabilizing layer to the layer of plastic material or polymer, wherein:

the applying of the stabilizing layer to the layer of plastic material or polymer is performed so as to balance induced stress between the stabilizing layer and the layer of plastic material or polymer on applying the transmission reduction layer to the plastic material or polymer layer.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
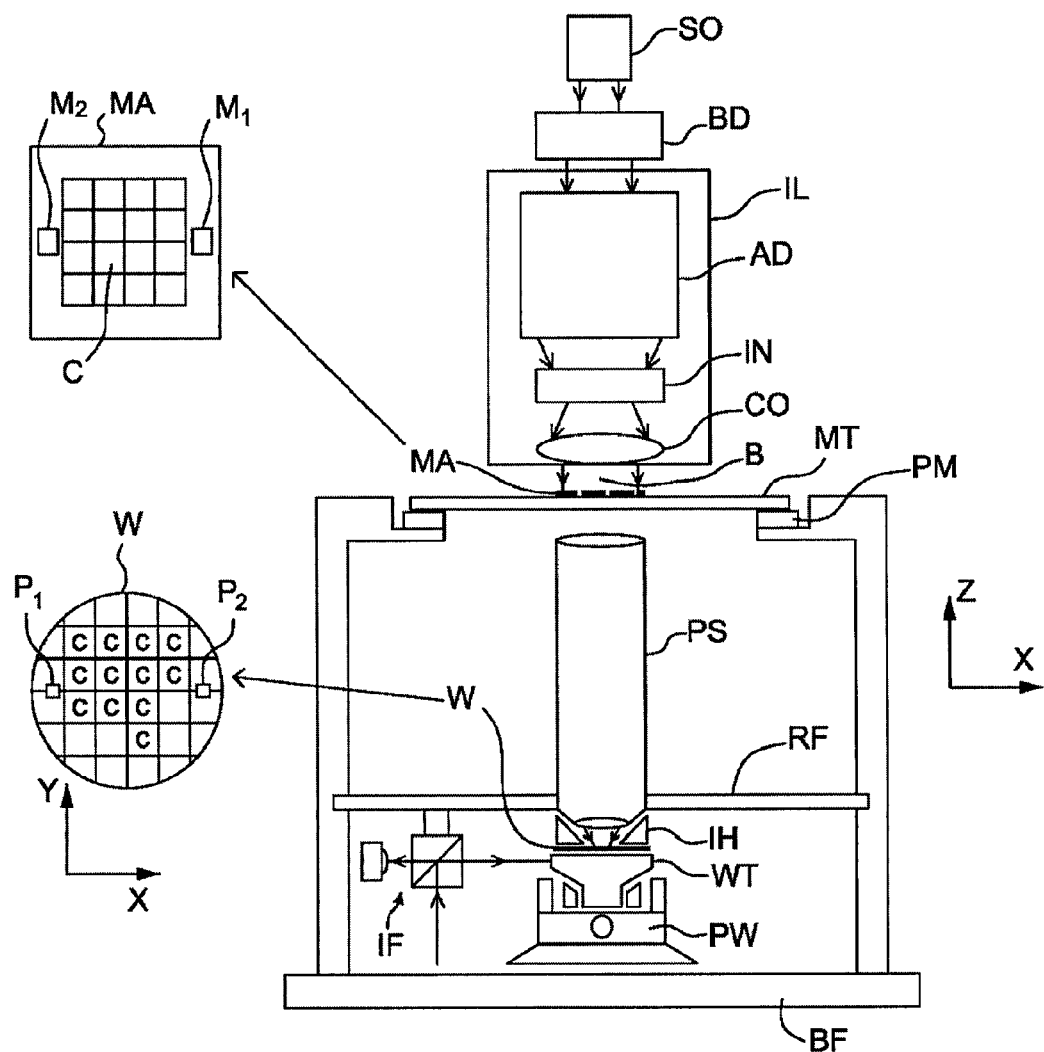
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate.

It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least three general categories. These are the bath type arrangement, the so-called localized immersion system and the all-wet immersion system. In the bath type arrangement substantially the whole of the substrate and optionally part of the substrate table is submersed in a bath of liquid.

The localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate moves underneath that area. FIGS. 2-5 show different supply devices which can be used in such a system. Sealing features are present to seal liquid to the localized area. One way which has been proposed to arrange for this is disclosed in PCT Patent Application Publication No. WO 99/49504.

In the all wet arrangement the liquid is unconfined. Substantially the whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 may be used in such a system. However, sealing features may not be present, may not be activated, may not be as efficient as normal or may be otherwise ineffective to seal liquid to only the localized area.

Figure 2:
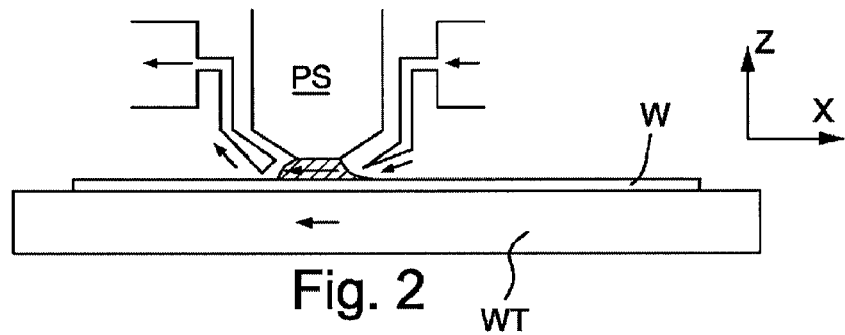
FIGS. 2 and 3 depict a liquid supply system for use in a lithographic projection apparatus.
Figure 3:
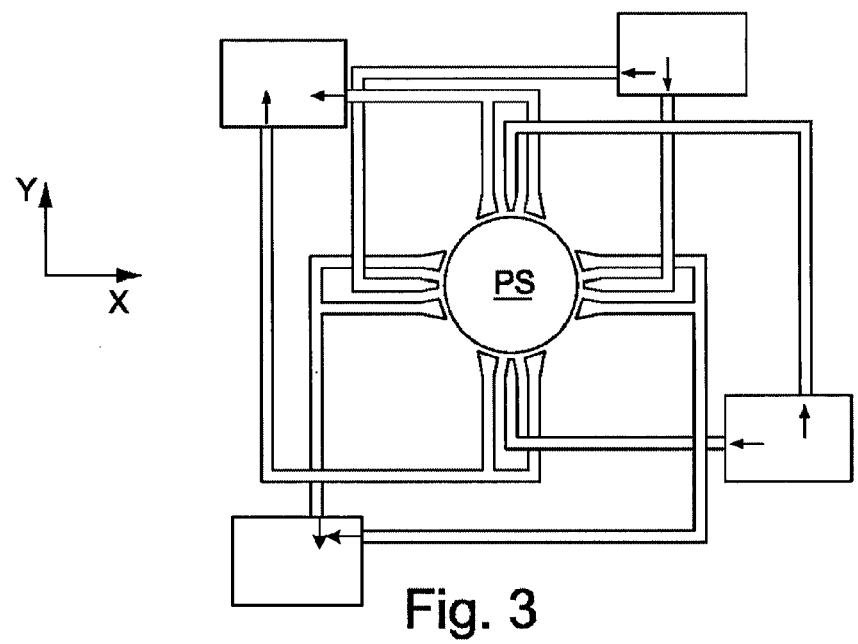

As illustrated in FIGS. 2 and 3, liquid is supplied by at least one inlet onto the substrate, preferably along the direction of movement of the substrate relative to the final element. Liquid is removed by at least one outlet after having passed under the projection system PS. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
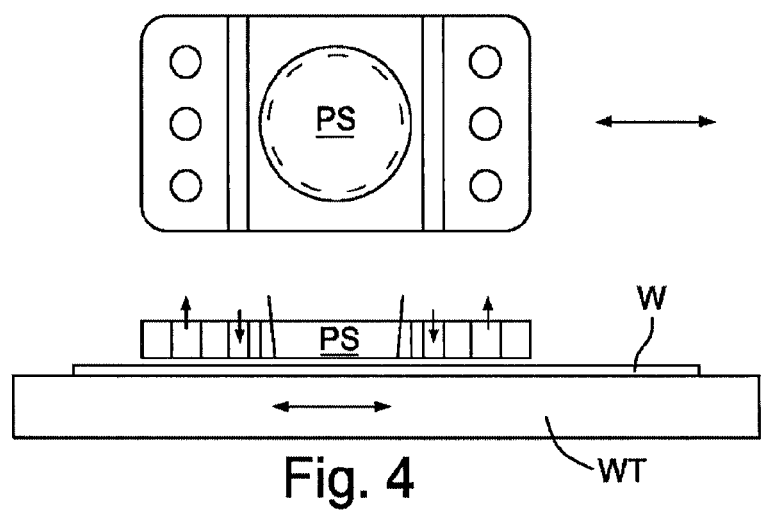
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS. Liquid is removed by a plurality of discrete outlets arranged radially outwardly of the inlets. The inlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate W is shown by arrows in FIG. 4.

Another arrangement which has been proposed is to provide the liquid supply system with liquid confinement structure which extends along at least a part of a boundary of the space between the final element of the projection system and the substrate table. Such an arrangement is illustrated in FIG. 5.

Figure 5:
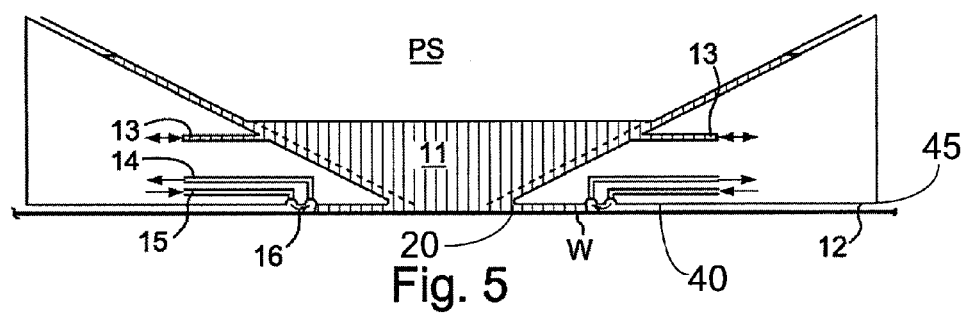
FIG. 5 depicts a further liquid supply system for use in a lithographic projection apparatus.

FIG. 5 schematically depicts a localized liquid supply system or fluid handling structure with a liquid confinement structure 12, which extends along at least a part of a boundary of the space 11 between the final element of the projection system PS and a facing surface (e.g. of a table, such as substrate table WT, or a substrate W which may be supported by the substrate table. The table may have a cover plate which may serve as the facing surface). (Please note that reference in the following text to the surface of the substrate W also refers in addition or in the alternative to a surface of the substrate table WT, unless expressly stated otherwise.) The liquid confinement structure 12 may be substantially stationary relative to the projection system PS in the XY plane. The liquid confinement structure 12 may move relative to the projection system in the Z direction (e.g. in the direction of the optical axis). In an embodiment, a seal is formed between the liquid confinement structure 12 and the facing surface. The seal may be a contactless seal such as a gas seal (such a system with a gas seal is disclosed in United States Patent Application Publication No. US 2004-0207824) or liquid seal.

The liquid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid may be provided. In an embodiment, the liquid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid may be contained in the space 11 by the contactless seal, e.g. gas seal 16, which, during use, may be formed between the bottom of the liquid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States Patent Application Publication No. US 2004-0207824, which is hereby incorporated by reference in its entirety. In another embodiment, the liquid confinement structure 12 does not have a gas seal.

The example of FIG. 5 may be a liquid confinement structure used in a localized immersion system or an all wet system as described herein.

The liquid confinement structure 12 of FIG. 5 may have other features. For example, the undersurface 40 of the liquid confinement structure 12 may have an extractor, for example a porous member. The extractor may be an extractor assembly radially inwardly of the outlet 14. The extractor assembly may extract liquid from between the liquid confinement structure 12 and the substrate W. The extractor assembly may operate as a single phase or as a dual phase extractor. The extractor assembly may comprise a liquid removal device or extractor or inlet such as the one disclosed in United States Patent Application Publication No. US 2006-0038968, incorporated herein in its entirety by reference. In an embodiment, the extractor comprises an inlet which is covered in a porous material which is used to separate liquid from gas to enable single-liquid phase liquid extraction. The meniscuses formed in the holes of the porous material prevent ambient gas from being drawn into a chamber of the extractor assembly. When the surface of the porous material comes into contact with liquid there is no meniscus to restrict flow. The liquid can flow freely into the chamber of the liquid removal device. In an embodiment, porous material is at least slightly liquidphilic with respect to the immersion liquid, e.g. water.

An arrangement in which such an extractor assembly is used in combination with a recess and a gas knife is disclosed in detail in United States Patent Application Publication No. US 2006/0158627 incorporated herein in its entirety by reference. An example of an embodiment of a liquid confinement structure suitable for use in an all wet embodiment can be found in United States Patent Application Publication No. US 2010-0060868.

An embodiment of liquid confinement structure for example as shown in FIG. 5 has features of a gas drag liquid confinement structure such as that described in U.S. Patent Application No. 61/181,158 filed 26 May 2009, which is hereby incorporated in its entirety by reference. United States Patent Application Publication No. US 2008/0212046 provides further details and its content is also hereby incorporated by reference in its entirety. Such a gas drag liquid confinement structure is used to remove liquid from between the liquid confinement structure 12 and the facing surface. It may be used instead of a porous member. The features of a gas drag liquid confinement structure include a plurality of openings formed in the undersurface of a confinement structure 12, around the periphery of the space 11. The openings are connected to an underpressure source so that liquid is removed from under the liquid confinement structure. The liquid forms a meniscus between the openings and the facing surface. The meniscus is as such pinned by the openings. Liquid may be removed through the openings in two phase. Such a confinement structure may have a gas seal to facilitate the removal of the liquid, the pinning of the meniscus to the openings or both.

In all of the above liquid confinement structures, liquid is supplied to a space 11 between the projection system PS and the facing surface. In the example of FIG. 5 the liquid is supplied through opening 13, so that it may serve as an inlet. Liquid may be removed from the space. In an embodiment immersion liquid is removed through an opening in the liquid confinement structure 12, for example opening 13, so that it serves as an outlet. Liquid may supplied through an opening 13 and removed from the same opening on the opposite side of the space.

Figure 6:
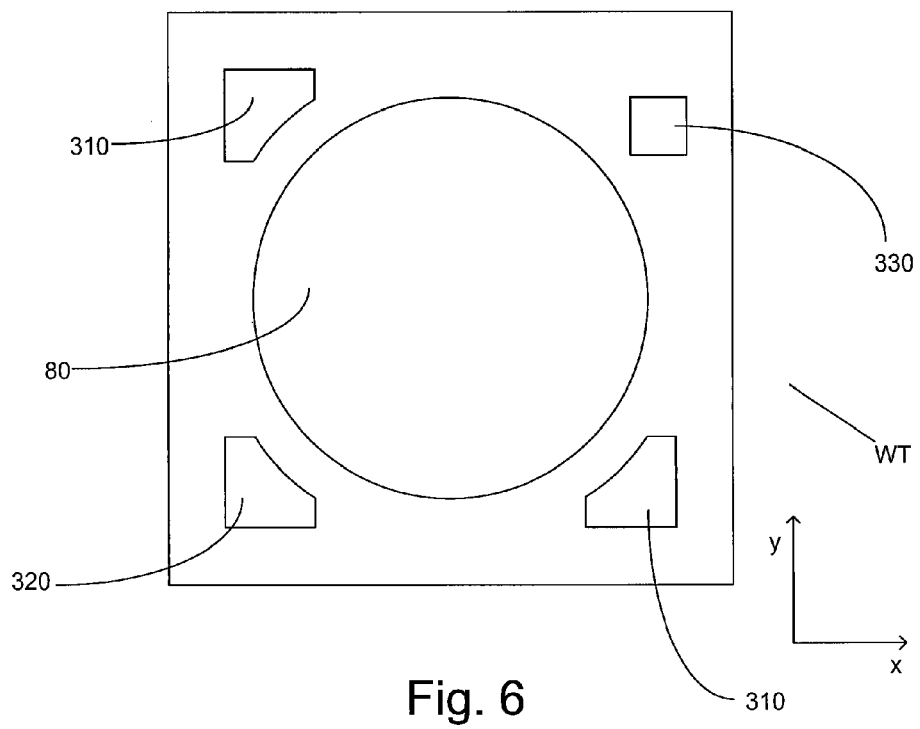
FIG. 6 depicts, in plan, a substrate table.

FIG. 6 illustrates a plan view of a top surface of a substrate table WT. In the top surface of the substrate table WT are formed various openings. The top surface of the substrate table WT may otherwise be substantially planar, for example in an axis perpendicular to the optical axis of the projection system. The substrate table WT may comprise a substrate support 80 for supporting a substrate W. The substrate support may be in a recess in the substrate table, for example in a top surface of the substrate table. The recess may be an opening in the top surface of the substrate table, for example as shown as a circular opening in FIG. 6. The recess may be dimensioned so that when a substrate is supported by the substrate support 80, the surface of the substrate facing away from the substrate support 80 is substantially co-planar with at least the surrounding surface of the substrate table WT.

The lithographic apparatus may have an interferometer system configured to determine the position of the substrate table WT, and therefore the substrate W (when supported by the substrate table WT). In an embodiment the substrate table WT may have a part of the interferometer system, for example one or more mirrors. The interferometer system may use radiation that is substantially in the plane of the surface of the substrate table WT, for example perpendicular to the optical axis of the lithographic apparatus, to calculate and determine the position of the substrate W. The interferometer system may determine the position of the substrate table WT and/or substrate W relative to another frame of reference, for example, the projection system, or the liquid confinement structure. Additionally or alternatively the lithographic apparatus may comprise an encoder system configured to determine the position of the substrate table WT, and therefore the substrate W (when supported by the substrate table WT). The encoder system may include one or more encoder sensors and one or more encoder blocks which may take the form of a grid that may be provided a graduated scale for accurate positioning. In an embodiment the substrate table WT may have a part of the encoder system, for example one or more encoder sensors and/or one or more encoder blocks. The encoder system may use radiation that is substantially parallel to the plane of the optical axis of the lithographic apparatus to calculate the position of the substrate table WT and/or substrate W. The encoder system may determine the position of the substrate table WT and/or substrate W relative to another frame of reference, for example, the projection system, or the liquid confinement structure.

In an embodiment, the substrate table WT may further comprise a cover plate. The top surface of the cover plate may form the top surface of the substrate table WT. The cover plate may be separable from the rest of the substrate table WT. The cover plate may have an opening through which a substrate may be placed on the substrate support 80. The top surface of the cover plate may provide a flat and continuous upper surface to the substrate table.

It is desirable that components of a substrate table WT may be removed to enable, for example in a non-limiting list, replacement, repair or cleaning of one or more components of the table. In an embodiment, the substrate support 80 is removable, without major dismantling (for example, removal) of one or more other components of the substrate table WT. The cover plate (if present) may be removably mounted. When present on the substrate table WT, the cover plate may cover one or more other elements of the substrate table WT. On removal of the cover plate, another element of the substrate table WT protected by the cover plate in use may be serviced.

One or more components may be positioned around the opening for the substrate support 80. At least one of these components may need to be illuminated by the beam B of the projection system PS during use. One or more of the components may be a sensor. In the example shown in FIG. 6, there are a number of sensors including two transmission image sensors (TIS) 310, a spot sensor 330 and an integrated lens interferometer at scanner (ILIAS) 320 sensor. If one or more of these sensors, e.g. optical components, are covered by the cover plate, at least part of the portion of the cover plate covering the sensor is transparent to the radiation detected by the respective sensor.

Figure 7:
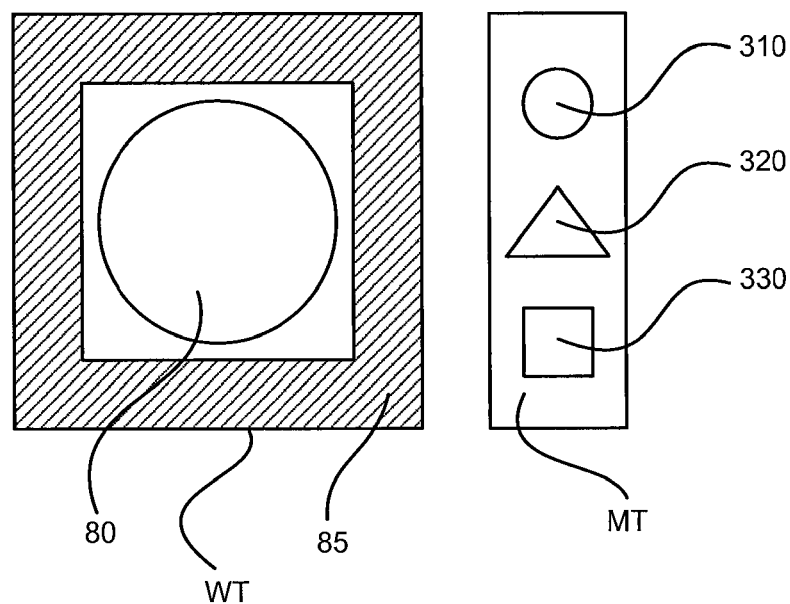
FIG. 7 depicts, in plan, a measurement table.

It is not necessary that the sensors are located in the same table which supports a substrate. FIG. 7 is a schematic representation of two tables, one of which is a substrate table WT and the other of which is a measurement table MRT. The substrate table WT is similar to the substrate table WT of FIG. 6. The substrate table WT has a substrate support 80 which is configured to support a substrate and a positioning system to enable accurate positioning of the substrate table WT, and therefore a supported substrate W, relative to another frame of reference, for example the projection system. In an embodiment the positioning system is an encoder system having one or more sensors and an encoder grid. In an embodiment an encoder grid 85 is arranged around the periphery of the substrate table. One or more encoder sensors may be positioned relative to the encoder grid, for example a base frame, so as to determine the position of the substrate table relative to the projection system. Each additional sensor may be located on the measurement table MRT, for example to minimize the weight of the substrate table WT. The features of the measurement table MRT may be the same as the substrate table WT, but without the feature of a substrate support 80. The measurement table may have one or more sensors 310, 320, 330. The measurement table may have a cleaning station. Each of the objects (the sensors, the encoder grid, the substrate support, and the cleaning station) may be located in a recess in the table MRT, WT. The surface of at least one of the objects (except at least the substrate support) may be co-planar with at least part of the table MRT, WT surrounding the respective object. In an embodiment, the substrate table WT and/or the measurement table MRT has a cover plate. In an embodiment the substrate table WT and/or the measurement table MRT has a top surface which is an un-removable, fixed component.

In the arrangements shown in each of FIGS. 6 and 7, it is desirable for there to be a good seal between the top surface of a table WT, MRT and an object located in an opening in the table MRT, WT, such as at least one of the sensors 310, 320, 330, the encoder grid 85 and the substrate support 80. It is desirable to have a good seal between an object and the surface of the table surrounding the object to prevent or reduce ingress of immersion liquid into a gap formed between the object and the table. Ingress of immersion liquid may be detrimental to the performance of the immersion lithographic apparatus. The liquid may damage one or more components, for example a delicate component such as a sensor, which may be fluidly connected to the gap for example if the gap is not sealed. Liquid in the gap may transport contamination into the gap, increasing the contamination within the gap. The contamination may be in the form of a particle, for example of a substrate coating. The contamination may be a non-volatile component of the immersion liquid, such as silica, which may remain after the liquid evaporates. The contamination may later be a source of imaging defectivity. On evaporating, the immersion liquid absorbs heat from its surroundings, distorting for example the surfaces forming the gap. Such distortion, for example on a sensor or a substrate support, may affect positioning information, affecting the accurate positioning of a beam onto a target portion of a substrate or sensor.

Figure 8:
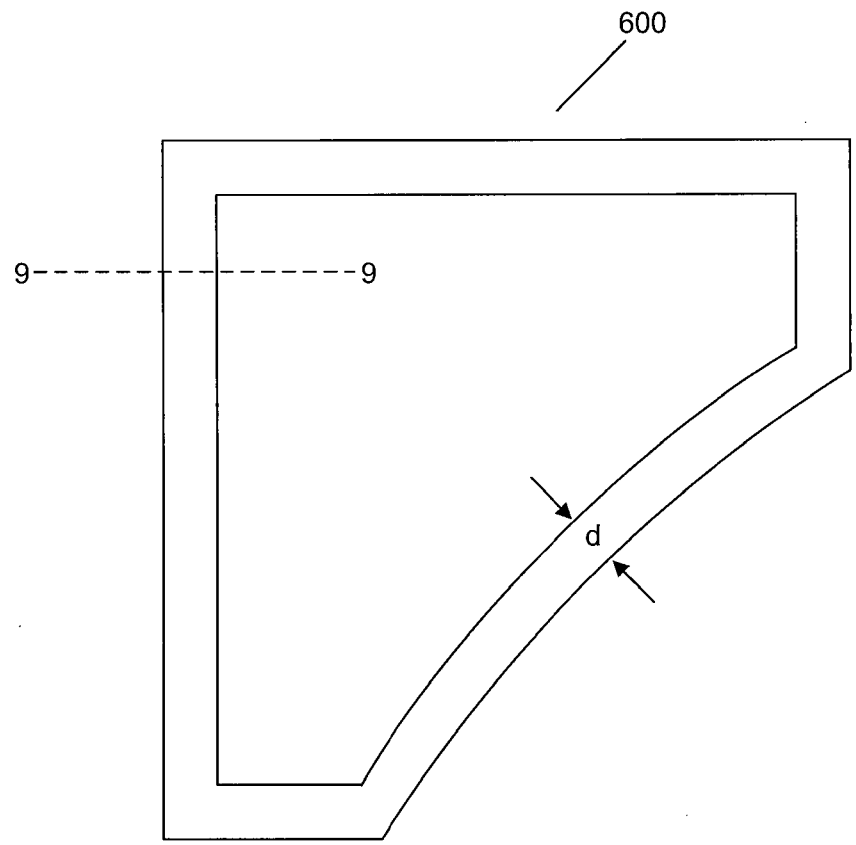
FIG. 8 depicts, in plan, a removable member of an embodiment of the invention in the form of a sealing member.

An embodiment of a sealing member 600 according to an embodiment of the invention is illustrated in plan in FIG. 8. The sealing member 600 may be removable, so that the sensor can be removed and optionally replaced on the table MRT, WT. In an embodiment, the sealing member 600 may be reused. The sealing member 600 may be disposable. As can be seen, the sealing member 600 is made as a closed loop which has a similar shape as a sensor 310, 320, 330 (or other object such as an encoder grid 85 and/or a substrate support 80) in substantially the same plane as the top surface of the table WT, MRT. The top surface of the table has an opening of similar shape to the sensor in the plane of the top surface of the table; the opening is dimensioned for the object to be placed therein. There may be a gap formed therebetween. The sealing member 600 has an internal periphery which is smaller than the shape of the supported object in the plane of the top surface of the table. The sealing member 600 has an external periphery which is larger than the shape of the opening. The sealing member 600 therefore has a width d, between the internal and external peripheries. In an embodiment the width d is of the order of 10 mm, although a range of from 0.2 mm to 50 mm is possible. Therefore, when the object is placed in the opening, and the sealing member 600 is placed around the periphery of the object, the sealing member 600 covers a portion of the object at its periphery, a part of the table MRT, WT around the opening and the gap formed therebetween.

Although the description herein generally relates in parts to a sealing member 600 for sealing the space, or gap, between an object such as a sensor 310, 320, 330 and the top surface of a table WT, MRT, it will be understood that a member similar to a sealing member may be used to seal the space, or gap, between any other two components of an immersion lithographic apparatus where it is desirable to prevent or reduce immersion liquid ingress. The sealing member 600 according to such embodiments may have a shape in plan view (i.e. the view of FIG. 8) adapted according to (for example corresponding to, or the same as) the shape of the gap to be sealed. For example, a sensor (such as a spot, TIS or ILIAS sensor) in some immersion lithographic apparatuses may have any shape, for example circular, in plan view (i.e. the views of FIG. 6 and FIG. 8). In this case, the sealing member 600 may have a corresponding circular shape, in plan view.

Examples of surfaces around which a sealing member 600 could be used include: between the body of a table WT, MRT (or cover plate of the table WT, MRT if present) and one or more sensors; between the periphery of the substrate support and a substrate table WT; around the radially outward undersurface of the final element of the projection system; and/or to cover an opening in the top surface of the substrate table WT, for example between an engagement portion of a removable bridge which may serve as a shutter member during substrate swap, and the top surface of a table MRT, WT. Alternatively or additionally, a sealing member 600 may be used to provide a surface with a specific physical property, for example a contact angle with respect to the immersion liquid, such as lyophobic (for example hydrophobic) surface. The sealing member 600 in this context may serve as a surface member, altering the surface which the sealing member covers.

A conventional sealing member (which may be referred to as a "sticker") is made of a metal, such as stainless steel. Such a stainless steel sealing member is very stiff. Typically, it may have a Young's modulus of about 200 GPa. The stainless steel sealing member would typically be attached to the surfaces of the components which are being sealed using an adhesive, such as an adhesive or glue layer. The stiffness of the adhesive is generally much lower than the stiffness of the stainless steel sticker. Furthermore, the adhesive generally has a visco-elastic property, and so may take a significant period of time to return to its original shape after being deformed. This has an impact on the force coupling between the two surfaces that are being sealed, as explained below in relation to FIGS. 9 and 10.

A conventional sealing member such as that described above is shown in cross section in FIG. 9. As shown, a conventional sealing member 500 has a conventional upper stainless steel seal portion 520 and a conventional adhesive layer 510. In the example shown in FIG. 9, the conventional sealing member 500 is being used to seal a gap 700 having a width x between a TIS sensor 310 and the top surface of a table, such as a substrate table WT (or a cover plate of the table if present). As noted above, a sealing member 500 of an appropriate shape (in plan view) could be used to seal a gap between any two or more components.

Figure 10:
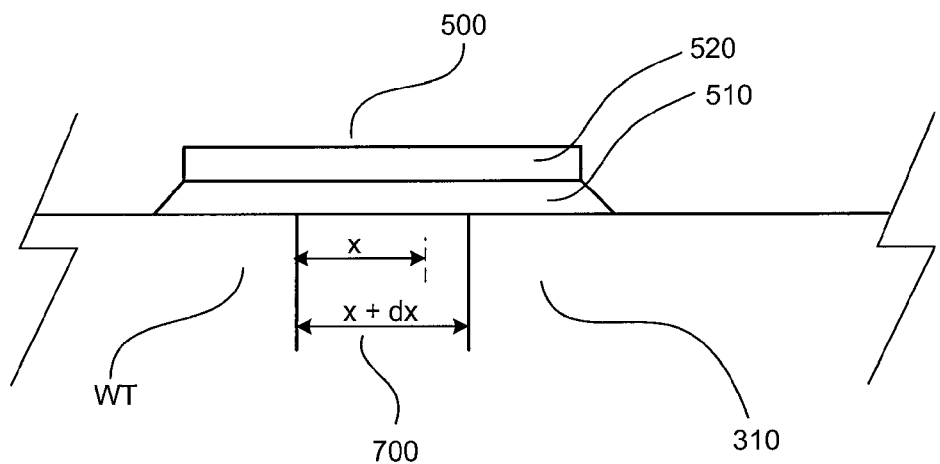
FIG. 10 depicts, in cross-section, a sealing member after movement, in a plane substantially parallel to the plane of the sealing member or the table, of at least one of the components forming the gap which the sealing member seals.

FIG. 10 shows a situation where relative movement between the two components forming the gap being sealed has occurred, i.e. in the frame of reference of one of the components, there is motion of one of the components relative to the other. In the example shown in FIG. 10, the TIS sensor 310 has moved relative to the substrate table WT by a distance dx. The relative movement in the example shown in FIG. 10 is in the x-y plane, i.e. in the plane parallel to the upper surface of the substrate table WT. The movement dx is in a plane parallel to the plane shown in the plan view of FIG. 6. This relative movement may result from, for example, the relative movement of the substrate table and the projection system during exposure exerting a force on the substrate table WT and/or sensor and/or substrate/substrate support. To achieve the desired speed of relative motion between the substrate table and the projection system for example during scanning or stepping, a large acceleration in the x-y plane is applied to the substrate table, and therefore to an object supported by the substrate table such as the TIS sensor 310. The acceleration is also applied to the sealing member 500 sealing the gap between the substrate table WT and the sensor. As the object is at least partly attached to the table by the sealing member, the forces generated by the acceleration between the object and the table are at least partly transmitted through the sealing member 500. The forces may generate a deformation movement dx in the sealing member 500. The movement dx is undesirable as it represents movement of the object relative to the supporting table, such as the substrate table WT. As the positioning system measures the substrate table, for example, relative to a frame of reference, such as the projection system, the movement dx may introduce an error into the positioning of the object, for example a substrate support 80 relative to the projection system. This may affect accurate positioning and exposure of, for example, a substrate supported by the substrate support 80.

As can be seen in FIG. 10, because the conventional sealing portion 520 is made of stainless steel it is relatively stiff. The conventional sealing portion 520 thus experiences very little or no deformation. Thus the shape of the conventional sealing portion 520 remains substantially unchanged between the original position of FIG. 9 and the position shown in FIG. 10 after relative movement of the two components forming the gap 700 being sealed. However, as explained herein, the conventional adhesive layer 510 is much less stiff than the conventional sealing portion 520. As such, any relative motion between the two components (for example sideways movement of the TIS sensor 310 in the x-y plane relative to the mirror substrate table WT in the example shown in FIG. 9) is transferred to the conventional adhesive layer 510. The conventional adhesive layer 510 in the conventional sealing member 500 may thus experience significant deformation.

Figure 9:
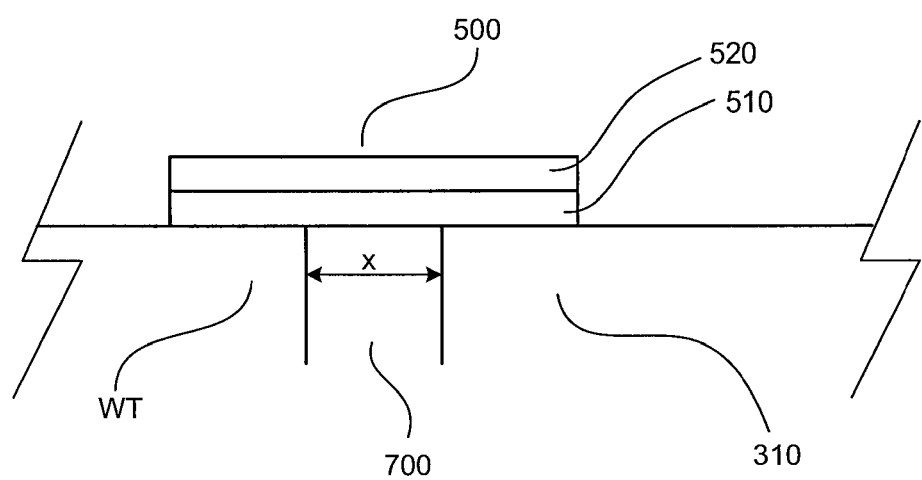
FIG. 9 depicts, in cross-section, a sealing member sealing a gap between two surfaces of an immersion lithographic apparatus such as a sensor and a surface of a table which holds the sensor.

The conventional adhesive layer 510 in the conventional sealing member 500 has a visco-elastic property. So after removal of the force that caused the relative movement between the two components forming the gap being sealed (for example the top surface of the substrate table WT and the TIS sensor 310 in FIG. 10), there is a delay in the two components WT, 310 returning to their original positions, for example as shown FIG. 9. The delay results from the time taken for the conventional adhesive layer 510 to return to its original shape and/or position; for example the time for the conventional sealing member to return to its original form as shown in FIG. 9 from the deformed shape of FIG. 10. The conventional adhesive layer 510 may act as a damper, providing a time-related force-coupling between the two components WT, 310 to which the sealing member 500 is attached.

In the conventional sealing member 500 shown in FIGS. 9 and 10, because the conventional sealing portion 520 is relatively much stiffer than the conventional adhesive layer 510, almost all of the relative movement between the two components WT, 310 is transferred to the adhesive layer 510. A larger deformation of the conventional adhesive layer results than if the deformation was distributed between the conventional sealing portion 520 and the conventional adhesive layer 510. The conventional adhesive layer 510 may be significantly deformed. After removal of the force which causes relative movement, the sealing member 500, i.e. having the conventional adhesive layer, takes a significant period of time for the conventional adhesive layer 510 to return to its original shape. This behavior is due to the visco-elastic relaxation of the adhesive layer 510. This visco-elastic relaxation can cause a loss of accuracy, because the time-related force-coupling between the two components being sealed causes uncertainty in the relative position between the two components. It may be difficult to determine and/or control the position of one or both of the components to which the conventional sealing member 500 is attached.

The undesirable force coupling effect of a conventional sealing member 500 may cause inaccurate exposure of a substrate W. One or more overlay errors may occur. Characteristic patterns in overlay errors that are attributable to the conventional sealing member 500 may be seen in specific step- and scan-directions. An embodiment of the invention provides a sealing member, for example a construction of sealing member 600, that addresses one or more of the force-coupling problems, for example the time-related force-coupling problem, set out herein.

Figure 11:
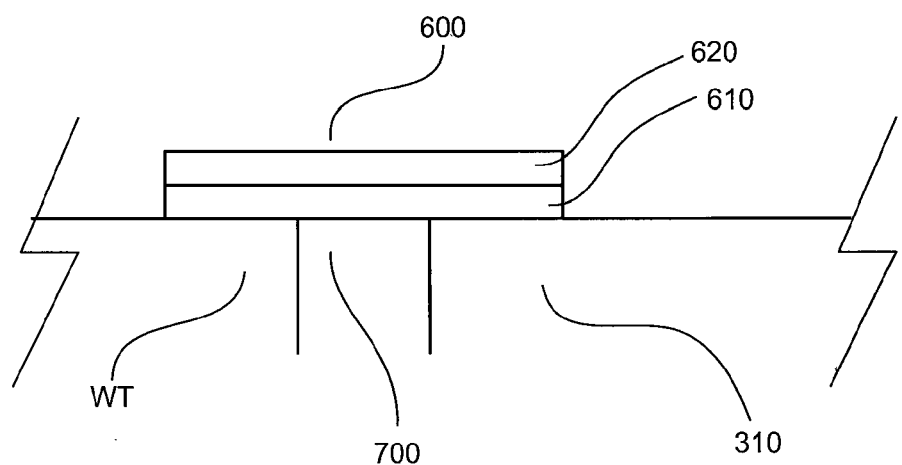
FIG. 11 depicts, in cross-section, a sealing member according to an embodiment of the invention sealing a gap between two surfaces of an immersion lithographic apparatus.

FIG. 11 shows a sealing member 600 according to an embodiment of the invention. The sealing member 600 has a similar basic configuration to the conventional sealing member 500 in that it has an adhesive layer 610 and a sealing portion 620. However, in an embodiment, the materials used for the adhesive layer 610 and the sealing portion 620 are selected to have one or more specific properties. These one or more properties may help to reduce, or desirably eliminate, the time-related force-coupling problem explained herein in relation to FIGS. 9 and 10.

In an embodiment, the stiffness of the sealing portion 620 is chosen to be significantly lower than that of the conventional sealing portion 520 of the conventional sealing member 500. This can be achieved, for example, by using a thinner (in cross-section) sealing portion 620. In the embodiment shown in FIG. 11, the stiffness of the sealing portion 620 is reduced compared to that of the conventional stainless steel sealing portion 520 by having a lower Young's modulus than the conventional sealing portion 520. The Young's modulus of the conventional sealing portion 520 is typically around 200 GPa. In an embodiment, the Young's modulus of the sealing portion 620 is below or equal to 50 GPa. In an embodiment, the Young's modulus of the sealing portion 620 is reduced to below or equal to 40 GPa. In an embodiment, the Young's modulus of the sealing portion 620 is reduced to below or equal to 30 GPa. In an embodiment, the Young's modulus of the sealing portion 620 is reduced to below or equal to 20 GPa. In an embodiment, the Young's modulus of the sealing portion 620 is reduced to below or equal to 10 GPa. In an embodiment, the Young's modulus of the sealing portion 620 is reduced to below or equal to 5 GPa. In an embodiment, the Young's modulus of the sealing portion 620 is reduced to around 2.5 GPa or below.

To achieve the reduction in Young's modulus in the sealing portion 620 in comparison with the conventional sealing portion 520 (which may be made of stainless steel) the sealing portion 620 is made from a plastic material or polymer. For example, the sealing portion 620 could comprise or consist of one or more of: polyimide, PET, PTFE, polyetheretherketone, or polyaryletheretherketone. The sealing portion 620 may comprise or consist of a polysiloxane, such as dimethylsiloxane, and/or poly(dimethylsiloxane). One or more silicone based polymers may be used. Desirably, any plastic material or polymer used in the sealing portion 620 should have a property of low rate of deterioration under the influence of contact with immersion liquid, for example purified water, and/or of exposure to exposure radiation. Deterioration may be by degradation, disintegration and/or leaching. A material with a low or non-existent leaching rate, for example leaching, may avoid adverse effects resulting from the material contaminating the immersion liquid, which may be, for example, ultrapure water. By way of example only, the leaching number may be less than $3.3 \times 10^{-4}$ $\mu/(cm^2 s)$. The plastic material may be a synthetic or semisynthetic organic amorphous solid material or a material that undergoes a non-reversible change of shape in response to an applied force.

Figure 12:
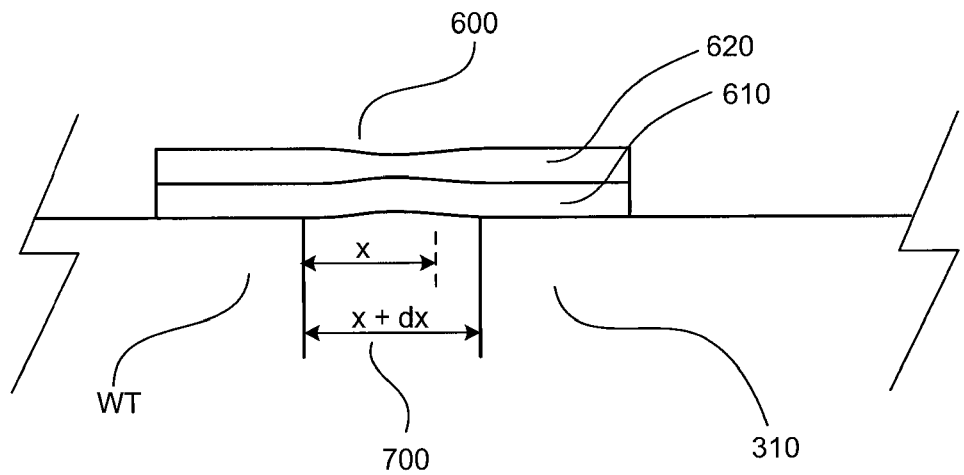
FIG. 12 depicts, in cross-section, the sealing member of FIG. 11 after movement, in a plane substantially parallel to the plane of the sealing member or the table, of at least one of the components forming the gap which the sealing member seals.

By using a sealing portion 620 with a reduced Young's modulus, a greater portion of any motion of one component relative to the other component forming the gap 700 being sealed is taken up, or accounted for, by deformation of the sealing portion 620. This effect can be seen in FIG. 12. In FIG. 12, there has been relative movement between the components WT, 310 sealed by the sealing member 600 by a distance dx in the x-y plane. The distance dx may be observed by comparing FIG. 11 with FIG. 12. In an embodiment, the distance dx is the same as the relative movement dx for the conventional sealing member 500 in FIG. 10. In an embodiment the Young's modulus of the sealing portion 620 in the sealing member 600 is selected to be similar to the Young's modulus of the adhesive layer 610, as shown in FIG. 12. Therefore, the sealing portion 620 may experience significant deformation in response to the movement dx. (In contrast, in the conventional arrangement shown in FIG. 10, the stiffness of the conventional sealing portion 520 is relatively much larger than that of the adhesive layer 510, and so the conventional sealing portion 520 thus experiences relatively little deformation).

As a result of the significant deformation of the sealing portion 620 of the sealing member 600, when a certain force is applied to the sealing member 600 and a conventional sealing member 500, the force, or stress, acting through the adhesive layer 610 is less than the force, or stress, acting through the conventional adhesive layer 510. The lower force, or stress, acting through the adhesive layer 610 means that, for example, for a certain acceleration of the substrate table WT to which the sealing member 600 and the conventional sealing member 500 are attached, the deformation of the adhesive layer 610 may be less than the deformation of the conventional adhesive layer 510. The time taken for the adhesive layer 610 as compared to the conventional adhesive layer 510 to return to its original shape shown in FIG. 11 after reduction, if not removal, of the force (for example that caused the relative movement between the two components WT, 310 by the distance dx) may be reduced. The deformed sealing portion 620 experiences much less (or substantially no) visco-elastic effect than the adhesive layer 610. This property of the sealing portion 620 may assist in returning the sealing member 600 to its original shape shown in FIG. 11. The sealing portion 620 may assist because the sealing portion 620 will try to return to its original shape more quickly than the adhesive layer 610, for example immediately. As a result, the time-related force-coupling between the two components 310, WT sealed by the sealing member 600 is reduced as compared to a conventional sealing member 500. The time over which the force transmission between the two components WT, 310 sealed by the sealing member 600 occurs (i.e. the settling time of the adhesive layer 610) is reduced. Thus, use of the sealing member 600 may help to reduce the occurrence of overlay errors during exposure and the magnitude of the errors.

Figure 13:
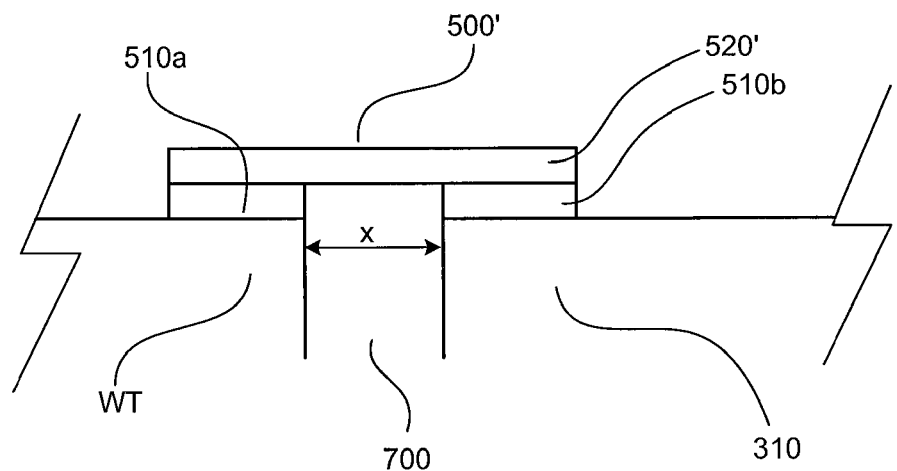
FIG. 13 depicts, in cross-section, a sealing member sealing a gap between two surfaces of an immersion lithographic apparatus such as a sensor provided in a table of FIG. 6 or FIG. 7 and the surface of the table.

FIG. 13 shows an arrangement of a conventional sealing member 500'. This conventional sealing member is the same as that shown in FIGS. 9 and 10, except in that the adhesive layer 510 is present in discrete portions 510*a* and 510*b*. The discrete portions 510*a*, 510*b* are located towards the ends of the width of the conventional sealing member 500; that is the areas of overlap of the conventional sealing member 500 and the surfaces of the two components which form the gap being sealed. The discrete portions 510*a*, 510*b* may attach the conventional sealing member 500' to the two different components forming the gap to be sealed. The arrangement suffers from the undesirable time-related force-coupling effect discussed herein. The force coupling effect may occur because of the visco-elastic deformation of at least one of the discrete adhesive portions 510*b*, 510*a*.

Figure 14:
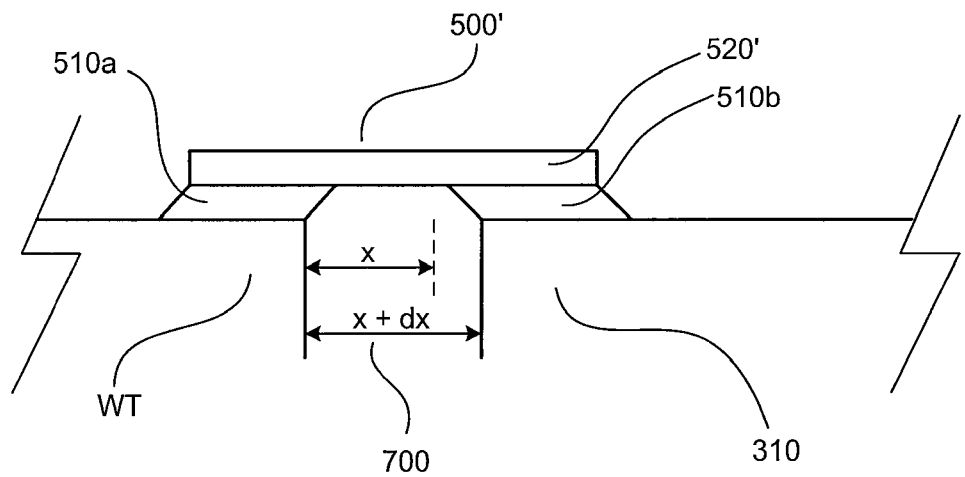
FIG. 14 depicts, in cross-section, the sealing member shown FIG. 13 after movement, in a plane substantially parallel to the plane of the sealing member or the table, of at least one of the components forming the gap which the sealing member seals.

FIG. 14 shows the deformation of the conventional sealing member 500' of FIG. 13 in response to a relative movement dx in the x-y plane between the two components WT, 310 to which the conventional sealing member is secured. Because the conventional sealing portion 520' of the conventional sealing member 500' is stiffer, for example much stiffer, than the conventional adhesive portions 510*a*, 510*b*, it remains relatively undeformed in response to the movement dx. Thus, the conventional adhesive portions 510*a*, 510*b* deform significantly in response to the movement dx. Thus, in an analogous way to the conventional sealing member 500 shown in FIGS. 9 and 10, on removal of the force that causes in the relative movement dx, a time-related force-coupling effect is generated by the deformation of the conventional adhesive portions 510*a*, 510*b*. A delay in the components 310, WT that form the sealed gap 700 returning to their original positions, as shown in FIG. 13, is caused. The delay in achieving the original position is a result of the visco-elastic relaxation rate of the conventional adhesive portions 510*a*, 510*b*. The time-related force-coupling, and the associated delay, may lead to overlay errors during exposure.

Figure 15:
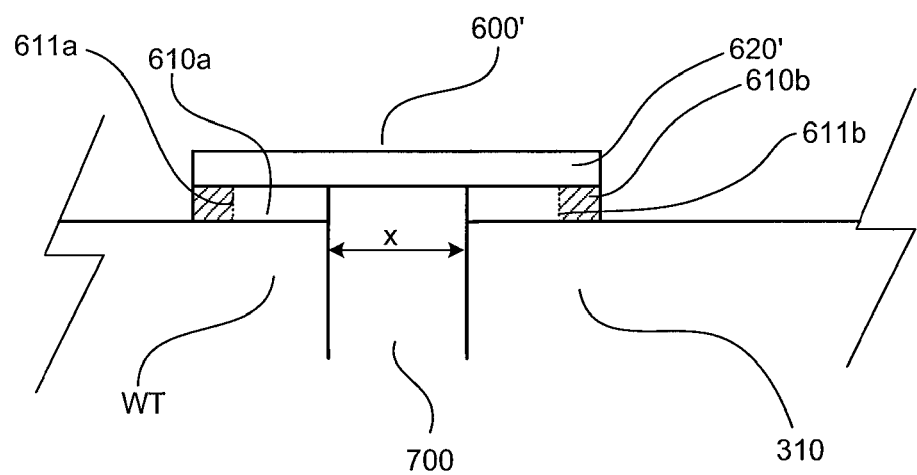
FIG. 15 depicts, in cross-section, a sealing member according to an embodiment of the invention sealing a gap between two surfaces of an immersion lithographic apparatus.

FIG. 15 shows a sealing member 600' according to an embodiment of the invention. The sealing member 600' has the same configuration as the conventional sealing member 500' shown in FIG. 13: the sealing member 600' comprises a sealing portion 620' and adhesive portions 610*a*, 610*b*. The adhesive portions 610*a*, 610*b* are each arranged to attach, or adhere, the sealing portion 620' to the surface of one of the two components WT, 310 which form the gap 700, respectively. The adhesive portions 610*a*, 610*b* may be arranged between the whole of the overlapping area between a surface 310, WT forming a gap 700 to be sealed and the sealing portion 620'. Alternatively, the adhesive portions 610*a*, 610*b* may be arranged between only a part of the overlapping area between a surface 310, WT forming a gap 700 to be sealed and the sealing portion 620'. In FIG. 15, an arrangement in which the adhesive portions 610*a*, 610*b* are arranged between only a part of the overlapping area between a surface 310, WT forming a gap 700 to be sealed and the sealing portion 620' is shown by the shaded area bounded in part by the dashed lines 611*a*, 611*b*. An arrangement in which the adhesive portions 610*a*, 610*b* are arranged between only a part of the overlapping area may result in a reduction in the time-related force-coupling of the adhesive portions 610*a* 610*b* compared with the arrangement in which the adhesive portions 610*a*, 610*b* are arranged between the whole of the overlapping area. The adhesive portions 610*a*, 610*b* may be liquid impermeable in at least some embodiments.

The sealing member 600' shown in FIG. 15 uses materials for the adhesive portions 610*a*, 610*b* and the sealing portion 620' that are chosen to have one or more specific properties. The one or more properties reduce, or desirably eliminate, the time-related force-coupling problem explained herein in relation to the conventional sealing member 500' shown in FIG. 13.

The stiffness of the sealing portion 620' of the embodiment shown in FIG. 15 may be chosen to be significantly lower than that of the conventional sealing portion 520', which may be made of stainless steel. The lower stiffness may be achieved by reducing the thickness of the sealing portion 620'. Additionally or alternatively, as with the sealing member 600 shown in FIG. 11, the stiffness may be reduced below that of the conventional sealing portion 520' by reducing the Young's modulus. The comments made herein in relation to the value of the Young's modulus of the sealing portion 620 of the sealing member described with reference to FIG. 11 may be applicable to the value of the Young's modulus of the sealing portion 620' shown in the embodiment of FIG. 15. The sealing portion 620' of FIG. 15 could be made from a similar material to that of the sealing portion 620 of the sealing member 600 described in relation to FIG. 12. So the sealing portion 620' may comprise or consist of one or more of: polyimide, PET, PTFE, polyetheretherketone, or polyaryletheretherketone. The sealing portion 620 may comprise or consist of a polysiloxane, such as dimethylsiloxane, and/or poly(dimethylsiloxane). Additionally or alternatively the sealing portion 620' may comprise or consist of one or more silicone based polymers.

Figure 16:
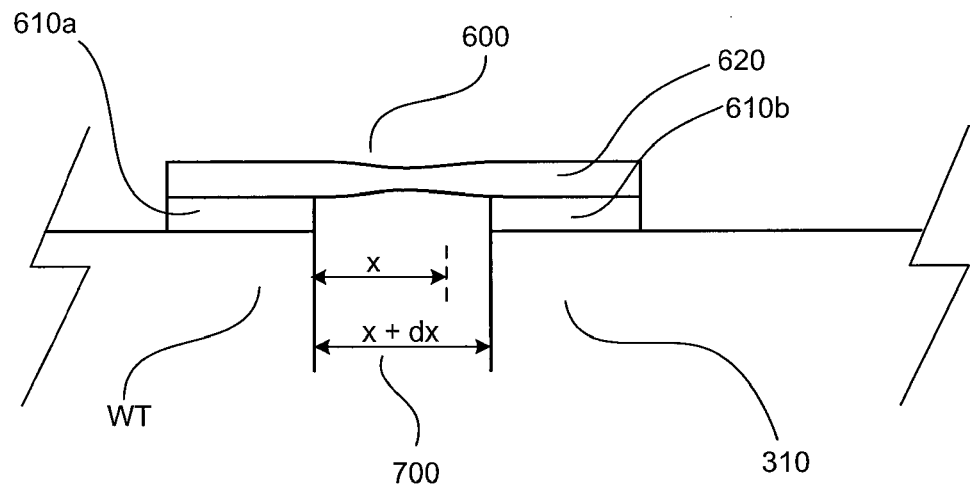
FIG. 16 depicts, in cross-section, the sealing member of FIG. 15 after movement of at least one of the surfaces sealed by the sealing member.

The deformation of the sealing member 600' according to the embodiment shown in FIG. 15 in response to a relative movement dx between the components 310, WT which form the gap 700 and to which the sealing member 600' may be attached, is shown in FIG. 16. FIG. 16 shows that, in contrast to the conventional arrangement of FIG. 14, the sealing portion 620' experiences a deformation, for example a significant deformation, in response to the movement dx. The sealing portion 620' has a stiffness (for example Young's modulus) that is similar (or more similar than conventionally) to the adhesive portions 610*a*, 610*b*. As shown in FIG. 16, the lower stiffness of the sealing portion 620' results in a significant reduction in the deformation of the adhesive portions 610*a*, 610*b* as compared with the deformations of the conventional adhesive portions 510*a*, 510*b* of a conventional sealing member 500', as shown in FIG. 14. As a result the time taken for the components 310, WT to which the sealing member 600' is attached to return to their original position (after removal of the force causing the movement dx) as compared to the use of a conventional sealing member 500' is less. The use of the sealing member 600' (of FIG. 15) has a smaller time-related force-coupling effect than the sealing member 500'. As the time related force coupling effect of the sealing member 600' and the conventional sealing member 500' is determined by the respective adhesive portions 510a, 510b, 610a, 610b, the visco-elastic relaxation time of the adhesive portions 610a, 610b is less than for the conventional adhesive portions 510a, 510b. Thus the time over which a force-coupling exists between the components 310, WT forming the sealed gap 700 is reduced. As such, as with the sealing member 600 as described herein with respect to FIGS. 10 and 11, the number of overlay errors may be reduced and the size of each overlay error may be reduced.

Improvements achieved by an embodiment of the invention in the time-related force-coupling between the two components forming the sealed gap 700 may be by having a sealing member in which the adhesive is provided at discrete portions 610a, 610b as well as a complete layer 610. Embodiments described herein concerns arrangements in which the adhesive is present in the form of part, if not a whole, layer. As such, any feature described herein may be provided to arrangements with an adhesive layer 610, or arrangements with discrete adhesive portions 610a, 610b.

Additionally or alternatively, there may be relative movement between the two components 310, WT forming the gap 700 sealed by the sealing member in a direction perpendicular to the x-y plane, e.g. in the plane of the top surface of the substrate table, and/or parallel to the optical axis of the projection system. The direction may be known as the z direction. The benefits discussed herein in relation to the sealing members 600, 600' described in relation to FIGS. 11, 12, 15 and 16 may apply to relative movement in the z direction between the two components 310, WT forming a gap sealed by the sealing member 600, 600'. The response of the sealing members 500, 600, 500', 600' to such relative movement in the z-direction is shown in FIGS. 17 to 20.

It will be appreciated that forces and/or relative movement between the components WT, 310 sealed by the sealing member 600/600' may be lower, for example significantly lower, in the z-direction than in the x-y plane. As such, the response of the sealing member 600/600' to deformation and/or forces in the z-direction may be less important than the response of the sealing member 600/600' to deformation and/or forces in the x-y plane.

Figure 17:
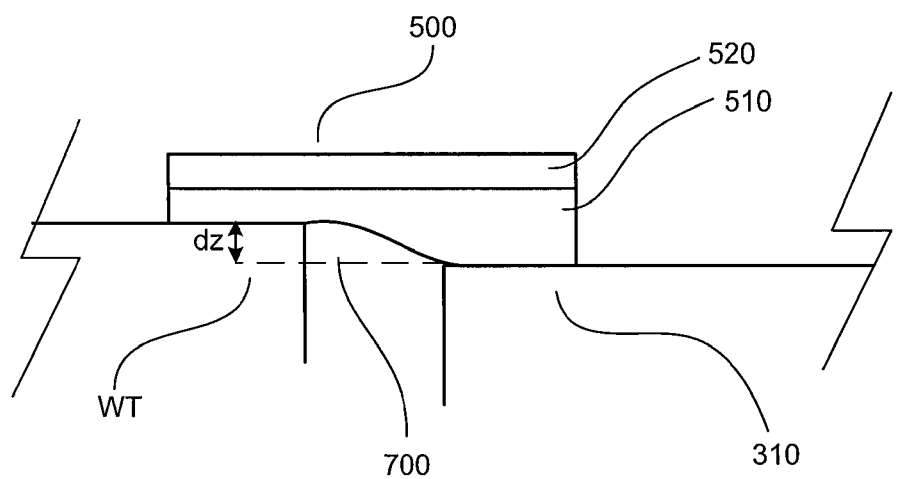
FIG. 17 depicts, in cross-section, the sealing member of FIG. 9 after movement, in a direction perpendicular to the plane of the sealing member, of at least one of the components forming the gap sealed by the sealing member.

FIG. 17 illustrates the deformation of the conventional sealing member 500 with a conventional adhesive layer 510 and a conventional sealing portion 520. The undeformed shape of this conventional sealing member 500 is shown in FIG. 9. As shown in FIG. 17, relative movement dz in the z direction between the two components 310, WT forming the sealed gap results in little or no deformation of the sealing portion 520. A large deformation occurs in the conventional adhesive layer 510. The noted deformations of the conventional adhesive layer 510 and the conventional sealing member 520 is because the conventional sealing portion 520 has much greater stiffness than the conventional adhesive layer 510. Because of the large deformation of the conventional adhesive layer 510, the time-based force-coupling between the two sealed components 310, WT occurs because of the visco-elastic property of the conventional adhesive layer 510. As a result there may be one or more difficulties in determining and/or controlling the position of one or both of the sealed components being sealed. Consequently a positioning error of the substrate during exposure may occur. Such an error may, for example, relate to focusing error.

Figure 19:
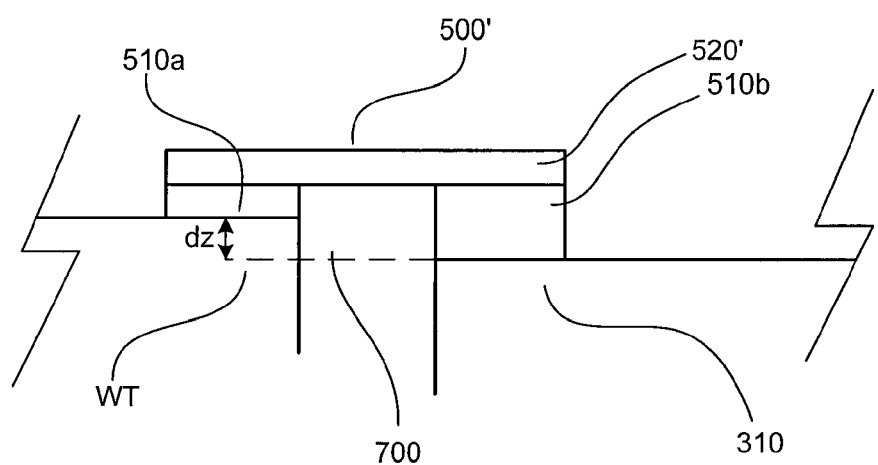
FIG. 19 depicts, in cross-section, the sealing member of FIG. 13 after movement, in a direction perpendicular to the plane of the sealing member, of at least one of the components forming the gap sealed by the sealing member.

The response of a conventional sealing member 500' having adhesive provided at discrete portions 510a, 510b, such as shown in FIG. 13, to relative movement in the z direction of the two components 310, WT sealed by a conventional sealing member 500' is shown in FIG. 19. Because the conventional sealing portion 520' is relatively much stiffer than the conventional adhesive portions 510a, 510b, one or more of the adhesive portions 510a, 510b may experience a relatively large deformation in response to the movement dz. Such movement dz may lead to a similar time-related force-coupling problem as described herein in relation to FIG. 17.

Figure 18:
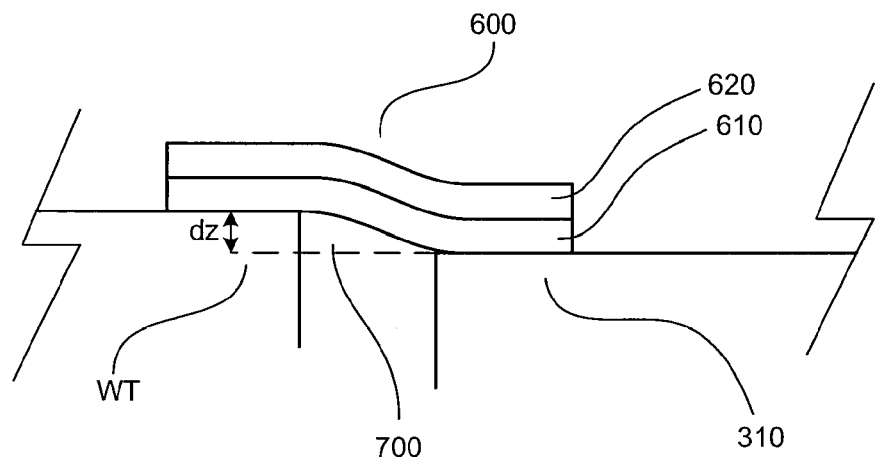
FIG. 18 depicts, in cross-section, the sealing member of FIG. 11 after movement, in a direction perpendicular to the plane of the sealing member, of at least one of the components forming the gap sealed by the sealing member.

FIG. 18 illustrates the response of a sealing member 600 which may be shown in its undeformed state, in FIG. 11. FIG. 18 shows the sealing member 600 deformed in response to relative movement in the z direction of the two components 310, WT sealed by the sealing member 600. As shown in FIG. 18, because the stiffness of the sealing portion 620 and the adhesive layer 610 is similar, the movement dz is absorbed, or accounted for, in both layers 610, 620. The deformation of the visco-elastic adhesive layer 610 is reduced in comparison with the visco-elastic conventional adhesive layer 510 shown in FIG. 17. The time-related force-coupling problem associated with the visco-elastic relaxation of the adhesive material is reduced in the adhesive layer 610 as compared to the conventional adhesive layer 510. This, in turn, improves the time-based positioning accuracy of the components 310, WT forming the sealed gap 700.

Figure 20:
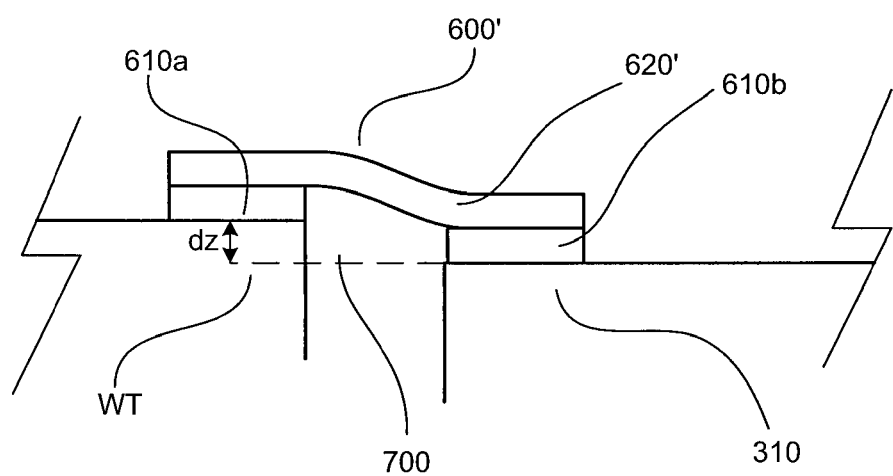
FIG. 20 depicts, in cross-section, the sealing member of FIG. 15 after movement, in a direction perpendicular to the plane of the sealing member, of at least one of the components forming the gap sealed by the sealing member.

FIG. 20 shows the deformation of the sealing member 600' in response to relative movement in the z direction between the two components 310, WT which form the gap 700. The sealing member 600' is shown in its undeformed state shown in FIG. 15. As shown in FIG. 20, the sealing portion 620' experiences greater deformation than the stiffer conventional sealing portion 520' in response to the relative movement dz. The response of the sealing portion 620' may be because the stiffness of the sealing portion 620' is more similar to the stiffness of adhesive portions 610a, 610b than the stiffness of the conventional sealing portion 520' is to the conventional adhesive portions 510a, 510b. Consequently under application of the same force in the z direction to the sealing member 600' and the conventional sealing member 500', there is less deformation of the adhesive portions 610a, 610b in comparison to the conventional sealing portions 510a, 510b. The time-based force-coupling between the two components 310, WT sealed by the sealing member 600' is less than if the two components were sealed by the conventional sealing member 500'.

In an embodiment, the stiffness of the sealing portion 620 may be chosen to be in the range of from 2% to 200% of (i.e. a factor of 0.02 to 2 times) the stiffness of the adhesive 610. In an embodiment, the stiffness of the sealing portion 620 may be chosen to be in the range of from 5% to 100% of (i.e. a factor of 0.05 to 1 times) the stiffness of the adhesive 610. In an embodiment, the stiffness of the sealing portion 620 may be chosen to be in the range of from 10% to 50% of (i.e. a factor of 0.1 to 0.5 times) the stiffness of the adhesive 610.

The Young's modulus of the sealing portion 620 may be chosen to be no more than $5 \times 10^5$ times (i.e. $5 \times 10^7$% of) the Young's modulus of the adhesive 610. In an embodiment, the Young's modulus of the sealing portion 620 may be chosen to be in the range of from $1 \times 10^3$ to $1 \times 10^5$ times (i.e. $1 \times 10^5$% to $1 \times 10^7$% of) the Young's modulus of the adhesive 610. In an embodiment, the Young's modulus of the sealing portion 620 may be chosen to be in the range of from $2 \times 10^3$ to $5 \times 10^4$ times (i.e. $2 \times 10^5$% to $5 \times 10^6$% of) the Young's modulus of the adhesive 610. In an embodiment, the Young's modulus of the sealing portion 620 may be chosen to be around $1 \times 10^4$ (i.e.

$1 \times 10^6$% of) the Young's modulus of the adhesive 610. This can be achieved by, for example, having the sealing portion 620 comprising or consisting of a suitable plastic material or polymer, such as polyimide, PET, PTFE, polyetheretherketone, and/or polyaryletheretherketone. The sealing portion 620 may comprise a polysiloxane, such as dimethylsiloxane, and/or poly(dimethylsiloxane). Additionally or alternatively, the sealing portion 620 may comprise or consist of at least one silicone based polymer.

In an embodiment, the time-related force-coupling effect resulting from the visco-elasticity of the adhesive layer 610 may additionally or alternatively be improved. For example, the time over which the force-coupling occurs due to visco-elastic settling may be reduced. The improvement may be achieved by reducing the damping, for example the damping constant or viscous damping coefficient, of the adhesive 610. In an embodiment, the viscous damping coefficient of the adhesive is less than or equal to $5 \times 10^6$ Ns/m. In an embodiment, the viscous damping coefficient of the adhesive is less than or equal to $2 \times 10^6$ Ns/m. In an embodiment, the viscous damping coefficient of the adhesive is less than or equal to $1 \times 10^6$ Ns/m. In an embodiment, the viscous damping coefficient of the adhesive is less than or equal to $5 \times 10^5$ Ns/m. In an embodiment, the viscous damping coefficient of the adhesive is less than or equal to $2 \times 10^5$ Ns/m. In an embodiment, the viscous damping coefficient of the adhesive is less than or equal to $1 \times 10^5$ Ns/m. The viscous damping coefficient may be lower than the viscous damping coefficient of the adhesive 510 used in an conventional sealing member 500. The adhesive 610 may comprise an acrylic adhesive. An acrylic adhesive may comprise an acrylic polymer. The acrylic polymer may have UV cross-linkings. The acrylic polymer may have an acryl group (which may have the structure [R—C(=O)—CH=CH—R]). Alternatively or additionally, the adhesive 610 may comprise a silicone adhesive. The silicone adhesive may comprise a compounded solution of polydimethyl siloxane gum and/or resin. The solution may be diluted in toluene.

By using an adhesive with a lower viscous damping coefficient than is conventional, the settling time of the adhesive (for example the adhesive layer 610 or the adhesive portions 610a, 610b) is reduced. The force coupling (or force transfer) between the two components forming the gap being sealed may occur over a reduced time period. The time reduction may help to reduce the time-based force-coupling between the two components 310, WT forming the sealed gap. A reduction in the time-based force-coupling between the components 310, WT forming the gap 700 may help to reduce the errors (for example overlay errors) resulting from the time-based force-coupling.

Figure 26:
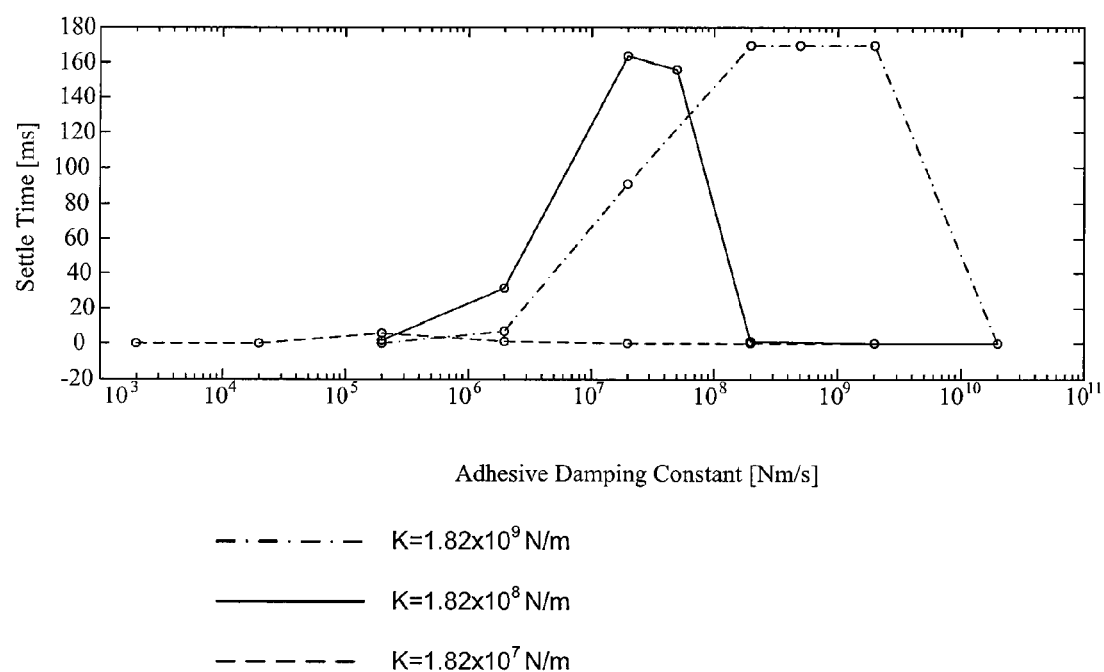
FIG. 26 is a graph showing the effect of adhesive damping constant and sealing portion stiffness on the settling time of a sealing member.

FIG. 26 shows predicted results produced using various values of stiffness (K) of sealing portion 620, and various different viscous damping coefficients of the adhesive layer 610 of a sealing member 600. The predicted results are based on a computer simulation. The graph shows the impact of these parameters on the settling time of the adhesive. For the purposes of FIG. 26 at least, the settling time is defined to the time taken for a gap 700 that is sealed to return to within a certain percentage, or distance, of its original size after a displacing force is removed. For example, the settling time may be defined as the time taken for the width of the gap to return to within 0.1 nm of its original width.

As shown by the dashed line ($K=1.82 \times 10^7$ GPa) in FIG. 26, if the stiffness (K) of the sealing portion 620 is reduced below conventional levels (for example in the manner described herein), the settling time of the adhesive is greatly reduced for all viscous damping coefficients. However, the solid and dot-chain lines (representing $K=1.82 \times 10^8$ GPa and $K=1.82 \times 10^9$ GPa respectively) show that for higher sealing portion 620 stiffness, the settling time can be increased to between 2 and 3 minutes depending on the viscous damping coefficient of the adhesive layer 610. Thus, FIG. 26 clearly illustrates that both stiffness (K) of sealing portion 620 and viscous damping coefficient of the adhesive layer 610 have a significant impact on the settling time of the adhesive. However, it will be appreciated that values (for all parameters) other than those shown in FIG. 26 may be used.

In an embodiment the time-related force-coupling effect resulting from the visco-elasticity of the adhesive layer 610 may additionally or alternatively be improved. For example the time over which the force-coupling occurs due to visco-elastic settling may be reduced. The improvement may be achieved by providing adhesive 610 (for example as an adhesive layer 610) with a Young's modulus of greater than 1 MPa, desirably greater than or equal to 2 MPa. For example, the Young's modulus of the adhesive 610 may be in the range of from 1 MPa to 500 MPa. For example, the Young's modulus of the adhesive 610 may be in the range of from 2 MPa to 200 MPa. For example, the Young's modulus of the adhesive 610 may be in the range of from 5 MPa to 100 MPa. For example, the Young's modulus of the adhesive 610 may be in the range of from 10 MPa to 50 MPa. By providing an adhesive with a suitable Young's modulus (for example in a range above), the amount of deformation of adhesive 610 in response to a given relative movement between the two components being sealed may be reduced. For example, the relative motion may be reduced because a greater proportion of the relative movement is experienced, or absorbed, by the plastic material or polymer sealing portion 620. The plastic material or polymer sealing portion 620 may experience visco-elastic relaxation over a shorter period of time than the adhesive 610. Thus the time-related force-coupling may be reduced.

An adhesive suitable for providing the desired Young's modulus may comprise an acrylic adhesive. An acrylic adhesive may comprise an acrylic polymer. The acrylic polymer may have UV cross-linkings. The acrylic polymer may have an acryl group (which may have the structure [R—C(=O)—CH=CH—R]). Alternatively or additionally, the adhesive 610 may comprise a silicone adhesive. The silicone adhesive may comprise a compounded solution of polydimethyl siloxane gum and/or resin. The solution may be diluted in toluene.

It will be understood that any of the sealing members 600, 600' described herein may be flexible. The degree of flexibility (which may be expressed as the Young's modulus) is determined by the construction and/or materials used for the sealing member 600, as described herein. This flexibility affects the force coupling (both in terms of magnitude and duration) between the two components forming the gap 700 being sealed.

The sealing members 600, 600' described herein may be replaceable. This means that they may be removed, for example, in a non-limiting list, to enable a particular component to be removed, during maintenance, to be replaced or a combination of these purposes. After removing the sealing member 600, 600', the same sealing member 600, 600' may be replaced when the apparatus is rebuilt. Alternatively, the sealing member 600, 600' may be discarded and another sealing member 600, 600' may be used in its place when the apparatus is rebuilt. The sealing member may be disposable.

As described herein, the sealing member 600, 600' is a form of a sheet and may be a removable member which may be used to cover, or to bridge, a gap between surfaces. Additionally or alternatively, the sheet member may be removable. The sheet member may be used to provide or repair a surface property, for example a specific contact angle.

A member, referred to as a surface member, which is structurally similar to a sealing member 600, 600' according to an embodiment of the invention, may cover a surface of at least one component of a lithographic tool, for example in an immersion system. The surface member may provide the surface of a component with a specific property, for example surface contact angle with respect to immersion liquid, or UV resistance. In an embodiment the surface being covered has none of the physical properties provided by the surface member. The surface member thus provides the property to the surface to which it is applied. In an embodiment, the surface may have one or more of the properties provided by the surface member. In an embodiment the surface covered by the surface member already has a surface member providing one or more physical properties. The existing surface may have deteriorated, for example degraded or disintegrated. The surface member to be applied may serve as repair patch. The repair patch may cover the damaged surface or may replace an existing surface member, which is removed before the repair patch is applied. The surface member serving as a repair patch could be used to repair a damaged coating with a specific contact angle, for example on a surface, such as the top surface of a table, e.g. a substrate table away from a substrate holder. The surface provided by the member may be exposed to the immersion liquid, for example water such as ultra-pure water, the exposure radiation, or both. A surface exposed to such an environment, for example on repeated occasions, such as a sensor on the substrate table, may deteriorate after a period of time. It is desirable that deterioration of the member is reduced if not prevented. This may extend the lifetime of the member increasing the duration of use and the intervals at which the member should be removed to be replaced.

In the following description, as an embodiment of the invention may cover at least a part of a surface, the sealing portion 620 is referred to as a covering portion 620, the sealing member 600, 600' is referred to a surface member 600, 600' as it provides a new surface to the surface being covered.

In the embodiment described above in relation to FIGS. 11, 12, 15, 16, 18 and 20, the covering portion 620 of the surface member 600, 600' may be made from a plastic material or polymer. In the immersion lithographic apparatus, the surface member 600, 600' may be exposed to DUV radiation (radiation with the wavelength in the range of from 126 nm to 365 nm, for example 150 nm to 300 nm, for example 157 nm, 180 nm to 200 nm (for example 193 nm) and/or 248 nm).

A typical plastic material or polymer may be transparent to DUV radiation (i.e. may transmit DUV radiation). The DUV radiation may react adversely with the adhesive 610. Delamination of the surface member 600, 600' could result. For example the covering portion 620 may become detached from the adhesive layer 610. The adhesive layer 610 may become detached from the surface to which it is adhered. Thus, in an embodiment, the covering portion 620 is opaque to DUV radiation.

The plastic material or polymer used in the covering portion 620 may react adversely with DUV radiation if it is not adequately protected. For example, the plastic material or polymer may be structurally damaged by exposure to DUV radiation. This may result in increased leaching of the plastic material or polymer. The surface contact angle with respect to the immersion liquid of a plastic material may decrease after reacting with DUV radiation. In an embodiment a lyophobic surface may become more lyophilic, or even lyophilic. It may be undesirable for the surface member 600, 600' to have a lyophilic surface. A surface with a certain lyophilicity relative to another may more readily retain immersion liquid than the other surface. A surface which more readily retains liquid may lead to a greater chance of a droplet remaining on the surface. The droplet can evaporate applying a heat load, applying at least one force to the surface, causing the surface to distort. The liquid in the droplet may contain impurities and/or a particle, which may be left on the surface after the droplet evaporates. A droplet may be in the path of a liquid confinement structure. The droplet may collide with a meniscus between the liquid confinement structure 12 and the surface of the surface member on which the droplet is situated. Such a collision could generate a bubble in the immersion liquid confined in the liquid confinement structure 12. Such a bubble may later be located in the path of radiation from the projection system to a target portion of a substrate W.

It is therefore additionally or alternatively desirable for the covering portion 620 to be resistant to DUV radiation and/or to prevent the DUV radiation being incident on the plastic material or polymer of the covering portion 620.

Figure 21:
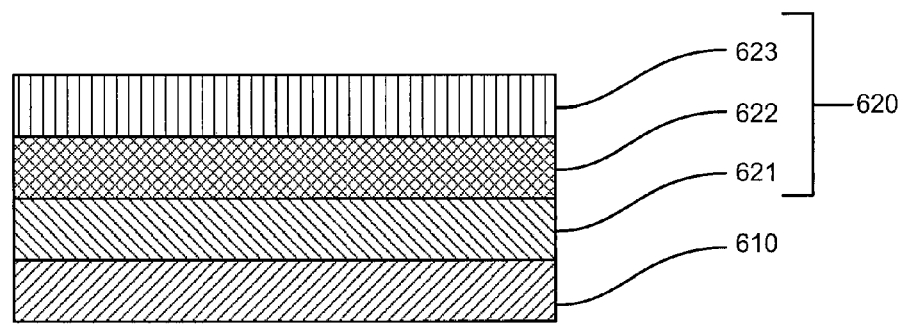
FIG. 21 is a schematic representation of a cross-section along line 9-9 of FIG. 8, through a removable member according to an embodiment of the invention.

According to an embodiment of the invention, the covering portion 620 is constructed as shown in FIG. 21. The covering portion 620 comprises three different layers: a layer 621 of plastic material or polymer, a transmission reduction layer 622 and a contact angle layer 623.

As noted herein, the layer 621 of plastic material or polymer may be, for example, polyimide, PET, PTFE, polyetheretherketone, polyaryletheretherketone, and/or polysiloxane. The layer 621 of plastic material or polymer may have a thickness in the range of from 2 μm to 50 μm, in the range of from 3 μm to 30 μm, in the range of from 5 μm to 20 μm, for example around 10 μm. The layer 621 of plastic material or polymer, in this embodiment, is formed adjacent to, for example attached to or adhered to, the adhesive 610.

The adhesive 610 may be a continuous layer 610 of adhesive, such as that shown in FIG. 11. Alternatively, the adhesive 610 may only be formed on discrete areas of the covering portion 620 so as to enable it to be fixed to the surfaces forming the gap being sealed. Such an arrangement of adhesive 610 is shown in FIG. 15.

In the embodiment of FIG. 21, on a surface, for example a top surface, of the layer 621 of plastic material or polymer is a layer 622. The layer 622 may be on the surface of the layer 621 of plastic material or polymer which is opposite to the surface of the layer 621 to which the adhesive 610 is present. The layer 622 serves to reduce the transmission of DUV radiation incident on the layer 621 of plastic material or polymer, for example in comparison with an embodiment in which the layer 622 it is not present. Therefore, the layer 622 may be referred to as a transmission reduction layer 622. Desirably, the transmission reduction layer 622 helps to reduce, if not eliminate, the transmission of DUV radiation to the layer 621 of plastic material or polymer. In an embodiment, in use, the transmission reduction layer 622 is between the DUV radiation source and both (i) the layer 621 of plastic material or polymer, and (ii) the adhesive 610. In this location the transmission reduction layer 622 helps to protect (i) the layer 621 of plastic material or polymer, (ii) the adhesive 610 or (iii) both the layer 621 and the adhesive 610 from DUV degradation. For example, it may act to reduce the rate, if not the occurrence, of deterioration of the layer 621 of plastic material or polymer, adhesive 610, or both, that may occur due to DUV exposure. The deterioration may be leaching of a material into the immersion liquid, degradation (and even disintegration) as a consequence of interaction with UV radiation, perhaps in combination with an interaction with the immersion liquid, for example ultra pure water, or a combination of these deterioration processes. In some embodiments, the transmission reduction layer 622 may have an optical density of 4 (i.e. a transmission of less than 0.0001).

The transmission reduction layer 622 may be opaque to DUV radiation by being absorptive of DUV radiation. The transmission reduction layer 622 may alternatively or additionally be reflective to DUV radiation, and may optionally have an anti-reflective coating. A transmission reduction layer 622 may be formed by an organic, or an inorganic material. In an embodiment, chromium or titanium is used. The thickness of the transmission reduction layer 622 may typically be in the range of from 1 nm to 200 nm so that it is opaque to DUV radiation. Desirably the thickness of the transmission reduction layer 622 may be in the range of from 3 nm to 100 nm. In an embodiment the thickness of the transmission reduction layer 622 may be in the range of from 10 nm to 50 nm. In an embodiment the transmission reduction layer 622 has a thickness in the range of from 20 nm to 40 nm so that it is opaque to DUV radiation. The transmission reduction layer 622 may be in the range of from 25 nm to 30 nm in thickness. If the transmission reduction layer 622 is metallic, then the layer may be, for example, less than or equal to 200 nm, less than or equal to 50 nm, or less than or equal to 30 nm. It is desirable for the transmission reduction layer 622 to be thin so as maintain the stiffness of the covering portion 620. In an embodiment, the transmission reduction layer 622 does not significantly increase the stiffness of the covering portion 620.

In the embodiment of the surface member as shown in FIG. 21, the transmission reduction layer 622 is substantially un-transmissive to DUV radiation. The transmission reduction layer 622 has a contact angle layer 623 on its upper surface. The contact angle layer 623 may form an upper surface of the covering portion 620 (i.e. the surface exposed to the radiation and the surface which may contact immersion liquid). The contact angle layer 623 may have a surface to which immersion liquid has a contact angle relative to certain value, a specific range, or even a specific value. In an embodiment the liquid has a contact angle which is greater than or equal to a certain value. The contact angle layer 623 may have a receding contact angle of greater than or equal to 50 degrees, greater than or equal to 60 degrees, greater than or equal to 70 degrees or greater than or equal to 80 degrees. In an embodiment the contact angle layer 623 has a static angle which is greater than or equal to 90 degrees. Such a surface may be considered lyophobic. This may mean that the surface is relatively lyophobic, for example lyophobic relative to another surface. (The term lyophobic may be considered to have the same meaning as liquidphobic and as used herein includes the term hydrophobic).

In an embodiment, the contact angle layer 623 as shown FIG. 21 may be transmissive, or substantially transmissive, to DUV radiation. The contact angle layer 623 may comprise poly(dimethylsiloxane) for example dimethylsiloxane as described in United States Patent Application Publication No. US 2009-0206304 which is hereby incorporated by reference in its entirety. In an embodiment contact angle layer 623 may be resistant to DUV radiation. The contact angle layer 623 may have a thickness in the range of from 0.5 nm to 2000 nm, in the range of from 2 nm to 1000 nm, in the range of from 10 nm to 500 nm, in the range of from 50 nm to 200 nm, or in the range of from 75 nm to 100 nm.

The contact angle layer 623 helps to ensure that the immersion liquid (for example the water such as ultrapure water) is repelled away from the surface of the surface member 600, 600'. The immersion liquid moves away from (i.e. does not remain on) the surface of the surface member 600, 600'. The contact angle layer 623 helps to reduce the risk of a disadvantageous outcome that may be caused by a droplet remaining on the surface of the surface member 600, 600'. Such an outcome may be staining of the surface of the surface member for example caused by evaporation of liquid on the surface, thermal deformation of the surface member 600, 600' due to evaporation of liquid on the surface member 600, 600', and/or inclusion of gas bubbles in the immersion liquid in the space 11.

Figure 22:
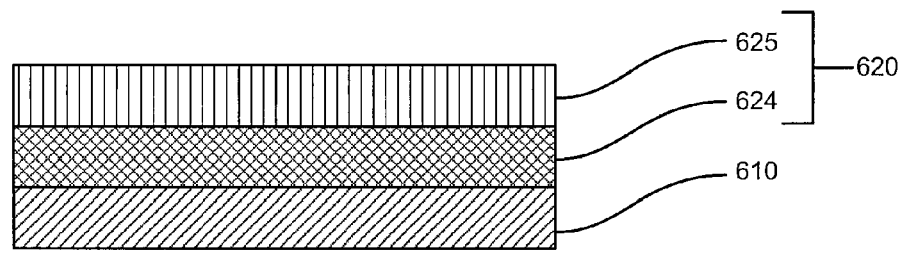
FIG. 22 is a schematic representation of a cross-section along line 9-9 of FIG. 8, through a removable member according to an embodiment of the invention.

An embodiment of the surface member 600, 600' is shown in FIG. 22. The surface member 600, 600' may have the same or similar functionality to the surface member 600, 600' shown in FIG. 21. The surface member 600, 600' of FIG. 22 has an adhesive layer 610 and a covering portion 620. The covering portion 620 has a layer 624 that has low, or substantially no, transmission of DUV radiation (also referred to as a transmission reduction layer 624) and a contact angle layer 625 of plastic material or polymer.

The transmission reduction layer 624 has low, or substantially no transmission of DUV radiation (hereinafter referred to as being opaque to DUV radiation). The transmission reduction layer 624 is provided so as to be present on the adhesive 610. In use, the transmission reduction layer 624 is between the adhesive 610 and the DUV radiation source. The transmission reduction layer 624 is in contact with the adhesive 620. The adhesive 620 may or may not be in the form of a layer. The transmission reduction layer 624 may have the same properties, comprise the same material, or both, as the equivalent transmission reduction layer 622 described herein. The thickness of the transmission reduction layer 624 is in the range of from 0.1 μm to 15 μm, in the range of from 1 μm to 10 μm, in the range of from 2 μm to 4 μm, or desirably around 3 μm.

On a surface, for example the top surface, of the transmission reduction layer 624 there is formed a contact angle layer 625 of plastic material or polymer (which herein is referred to as a contact angle layer 625). In an embodiment as shown in FIG. 22, the contact angle layer 625 is a plastic material or polymer as is layer 621 described herein. As well as being plastic material or polymer, the contact angle layer 625, like the contact angle layer 623 described herein, has a contact angle property with respect to immersion liquid and which is resistant to DUV radiation. Even though the DUV radiation may be incident upon the contact angle layer 625 which is a plastic material or polymer, because it is resistant to such DUV radiation, there is little or no deterioration, for example degradation, disintegration, leaching or a combination of these which is seen in the layer 621 if it were exposed to DUV radiation. The relatively high contact angle, for example the at least relative lyophobicity, of the contact angle layer 625 helps to ensure that immersion liquid (for example water such as ultra pure water) is repelled from the covering portion 620. As shown in FIG. 22, in an embodiment the surface, e.g. upper surface, of the surface member 600, 600' that contacts the immersion liquid and is exposed to the DUV radiation during use, is formed by the contact angle layer 625.

A suitable material for the contact angle layer 625 (which may be lyophobic, desirably hydrophobic) of plastic or polymer material may be a polysiloxane. A polysiloxane may be, for example, dimethylsiloxane, or poly(dimethylsiloxane) as described in United States Patent Application Publication No. US 2009-0206304 which is hereby incorporated by reference in its entirety. A typical thickness of the contact angle layer 625 of plastic or polymer material may be in the range of from 0.5 nm to 2000 nm, in the range of from 2 nm to 1200 nm, in the range of from 10 nm to 500 nm, in the range of from 50 nm to 200 nm, or in the range of from 75 nm to 100 nm.

Figure 23:
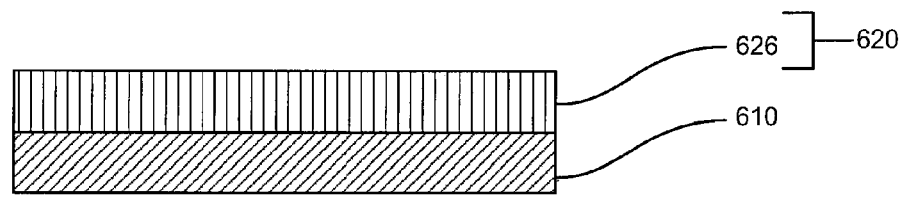
FIG. 23 is a schematic representation of a cross-section along line 9-9 of FIG. 8, through a removable member according to an embodiment of the invention.

FIG. 23 shows an embodiment of surface member 600, 600' according to an embodiment of the invention. In the embodiment the surface member 600, 600' has an adhesive 610 and a covering portion 620. The adhesive 610 may or may not be in the form of a layer. The covering portion 620 comprises a lyophobic plastic material or polymer layer 626, herein after referred to as a surface layer 626. The surface layer 626 may be a single layer; the covering portion may have a single constituent layer which is the surface layer 626. The surface layer 626 may have two major surfaces; the adhesive is present on one of the major surfaces of the surface layer 626 and the other major surface forms a surface of the covering portion 620 (and thus the surface member 600, 600'). The surface of the covering portion 620 in use contacts immersion liquid and is a part of the covering portion through which incidental DUV radiation generally first passes.

In an embodiment the surface layer 626 may be made of a plastic material or polymer. The surface layer 626 may be both resistant to DUV radiation and help to reduce the transmission of DUV radiation. In an embodiment the surface layer 626 is opaque to DUV radiation. By virtue of being resistant to DUV radiation, the surface layer 626 does not degrade as a consequence of exposure to DUV radiation. By virtue of reducing the transmission of DUV radiation, or even being opaque to DUV radiation, the surface layer 626 helps to reduce or even helps to prevent the adhesive 610 being exposed to DUV radiation. By reducing or preventing the exposure of the adhesive 610 to DUV radiation, the adverse effects of exposing the adhesive 610 to DUV radiation may be reduced, even prevented.

In the embodiments described herein, the transmission reduction layer 622, the transmission reduction layer 624, and the surface layer 626 that each help to reduce the transmission of DUV radiation therethrough may reflect, absorb or both reflect and absorb the DUV radiation. These layers 622, 624, 626 may be opaque to DUV radiation by reflecting and/or absorbing DUV radiation. Optionally, a layer which reduces the transmission of DUV radiation (e.g. the transmission reduction layers 622, 624, and surface layer 626) may comprise an anti-reflective coating. As noted above in relation to the transmission reduction layer 622, any of the layers 622, 624, 626 may act, as appropriate, to help protect one or more other layers, which may comprise (i) plastic material or polymer and/or (ii) adhesive, from DUV degradation. For example, the layer may act to reduce the usual increase in deterioration (e.g. leaching, degradation, or disintegration) of the plastic material or polymer present in a layer that may occur due to DUV exposure. In an embodiment the transmission reduction layers 622, 624 and the surface layer 626 may have an optical density of 4 (i.e. a transmission of less than 0.0001).

In order to produce a layer that absorbs DUV radiation, DUV radiation absorbing particles may be incorporated into a material forming a layer. The particles may, for example, be TiO and $Ta_2O_5$. The dimensions of the particles may be nanoscale, for example in the range of from 1 to 100 nm, less than or equal to 50 nm, or less than or equal to 10 nm. In an embodiment, the particles are incorporated into the surface layer 626. The DUV radiation absorbing particles may absorb the DUV radiation without influencing the contact angle interaction properties of the surface layer 626.

A suitable base material to which the DUV radiation absorbing particles are present for example in the surface layer 626 may be the same as the material present in the contact angle layer 625, for example a polysiloxane, such as dimethylsiloxane, or poly(dimethylsiloxane).

Figure 27:
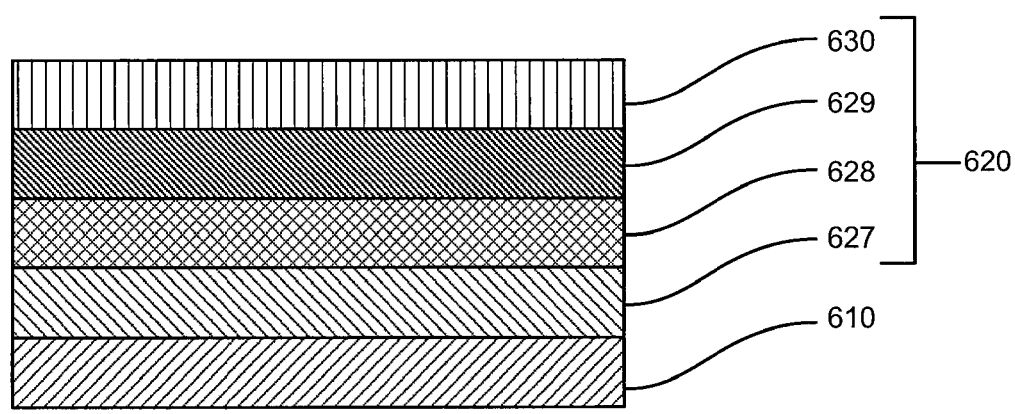
FIG. 27 is a schematic representation of a cross-section along line 9-9 of FIG. 8, through a removable member according to an embodiment of the invention.

An embodiment of the surface member 600, 600' is shown in FIG. 27. The surface member 600, 600' shown in FIG. 27 may have the same or similar purpose to the surface member 600, 600' shown in FIGS. 21, 22 and 23.

The covering portion 620 of the surface member 600, 600' shown in FIG. 27 has a layer 628 of plastic material or polymer. The covering portion 620 of the surface member 600, 600' shown in FIG. 27 has a transmission reduction layer 629. The transmission reduction layer 629 is on the layer 628 of plastic material or polymer. The covering portion 620 of the surface member 600, 600' shown in FIG. 27 has a further transmission reduction layer 627. The layer 628 of plastic material or polymer is on the further transmission reduction layer 627. The covering portion 620 of the surface member 600, 600' shown in FIG. 27 has a contact angle layer 630. The contact angle layer 630 is on the upper surface of the transmission reduction layer 629. During manufacture, a layer may be formed on a pre-existing adjacent layer.

Some embodiments may not include all of the layers 627, 628, 629, 630 of the covering portion 620. For example, an embodiment may omit the contact angle layer 630.

The construction of at least some of the layers of the surface member 600, 600' shown in FIG. 27 may be similar to or the same as the construction of equivalent layers of the surface member 600, 600' shown in FIG. 21. In particular, each of the embodiment of FIG. 21 and the embodiment of FIG. 27 has an adhesive (for example an adhesive layer) 610 on which a covering portion 620 is formed.

The layer 628 of plastic material or polymer of the embodiment shown in FIG. 27 may be similar to, or the same as, the layer 621 of plastic material or polymer in the embodiment of FIG. 21. At least part if not all of the description herein relating to the properties (for example dimensions and/or materials and/or mechanical properties) of the plastic material or polymer layer 621 of the embodiment shown in FIG. 21 may apply to the layer 628 of plastic material or polymer in the embodiment of FIG. 27. By way of example, the layer 628 of plastic material or polymer shown in FIG. 27 may comprise polyetheretherketone and/or polyimide. By way of example, the thickness of the layer 628 of plastic material or polymer in the embodiment shown in FIG. 27 may be on the order of 8 to 10 μm. However, it is emphasized that some, if not all, of the ranges of dimensions, and examples of materials, described above in relation to the layer 621 of plastic material or polymer shown in FIG. 21 may apply to the layer 628 of plastic material or polymer shown in FIG. 27.

The transmission reduction layer 629 shown in the embodiment of FIG. 27 may have properties (for example dimensions and/or materials and/or mechanical properties) that are similar to, or the same as, the transmission reduction layer 622 of the embodiment shown in FIG. 21. At least part if not all of the description (in terms of, for example, the dimensions and/or materials and/or properties) of the transmission reduction layer 622 provided herein in relation to the embodiment of FIG. 21 may apply to the transmission reduction layer 629 of the embodiment shown in FIG. 27.

By way of example, the transmission reduction layer 629 of the embodiment shown in FIG. 27 may comprise or consist of chromium and/or titanium. The transmission reduction layer 629 may be a metal layer 629, which may be referred to as a first metal layer 629. The metal layer 629 may be a metallization layer formed on the layer 628 of plastic material or polymer. In an embodiment, the transmission reduction layer 629 of the embodiment shown in FIG. 27 may be a chromium layer. In an embodiment the transmission reduction layer 629 shown in the embodiment of FIG. 27 may have a thickness in the range of from 60 nm to 75 nm. In an embodiment, the transmission reduction layer 629 of the embodiment shown in FIG. 27 may be a chromium layer with a thickness on the order of 60 nm. However, a part, if not all, of the description herein relating to the transmission reduction layer 622 of the embodiment shown in FIG. 21 (in terms, for example, of the mechanical properties, dimensions, and materials) may apply to the transmission reduction layer 629 of the embodiment shown in FIG. 27.

The contact angle layer 630 of the embodiment shown in FIG. 27 may be similar to, or the same as, the contact angle layer 623 of the embodiment shown in FIG. 21 (for example dimensions and/or materials and/or mechanical properties). A part if not all of the description herein relating to the contact angle layer 623 of the embodiment shown in FIG. 21 may apply to the contact angle layer 630 of the embodiment shown in FIG. 27. By way of example, the contact angle layer 630 of the embodiment shown in FIG. 27 may comprise poly(dimethylsiloxane), for example dimethylsiloxane. For example, the thickness of the contact angle layer 630 of the embodiment shown in FIG. 27 may be on the order of 200 nm. However, these dimensions and materials are by way of example. Part, if not all, of the description relating to the contact angle layer 623 of the embodiment shown in FIG. 21 may apply to the contact angle layer 630 of the embodiment shown in FIG. 27.

The covering portion 620 of the surface member 600, 600' shown in FIG. 27 may have a further transmission reduction layer 627. The further transmission reduction layer 627 is in addition to the transmission reduction layer 629 described above. The further transmission reduction layer 627 may be positioned below the layer 628 of plastic material or polymer. The further transmission reduction layer 627 may be on the opposite surface (for example major surface) of the layer 628 of plastic material or polymer to the transmission reduction layer 629. The layer 628 of plastic material or polymer may be positioned between the two transmission reduction layers 627, 629.

The further transmission reduction layer 627 may have properties (for example dimensions and/or materials and/or mechanical properties) that are similar to, or the same as, the transmission reduction layer 629. At least part, if not all, of the description herein relating to the properties (for example dimensions and/or materials and/or mechanical properties) of the transmission reduction layer 622 of the embodiment shown in FIG. 21 may apply to the further transmission reduction layer 627 of the embodiment shown in FIG. 27, except as described otherwise herein.

In an embodiment, the further transmission reduction layer 627 comprises a metal. In an embodiment, the further transmission reduction layer 627 is a metal layer, for example a metallization layer on the layer 628 of plastic material or polymer. Both the further transmission reduction layer 627 and the transmission reduction layer 629 may be metal layers, for example metallization layers. In that case, the further transmission reduction layer 627 may be referred to as the second metal layer, and the transmission reduction layer 629 may be referred to as the first metal layer.

In an embodiment, the further transmission reduction layer 627 may comprise titanium and/or chromium. In an embodiment, the further transmission reduction layer 627 may be a chromium layer. In an embodiment, the thickness of the further transmission reduction layer 627 may be in the range of from 60 nm to 75 nm. One or more of the properties (for example the dimensions, and/or the materials, and/or the mechanical properties) of the further transmission reduction layer 627 of the embodiment shown in FIG. 27 may be similar to, or the same as, the transmission reduction layer 622 of the embodiment shown in FIG. 21. Thus, all of the dimensions, properties, and materials described herein in relation to the transmission reduction layer 622 of the embodiment shown in FIG. 21 may apply to the further transmission reduction layer 627 of the embodiment shown in FIG. 27.

In the embodiment shown in FIG. 27, the sealing member 600, 600' comprises an adhesive 610 (e.g. as an adhesive layer). The properties (for example the dimensions, and/or the materials, and/or the mechanical properties) of the adhesive 610 are the same as the properties of the adhesive 610 described elsewhere in this description for example in relation to the embodiments shown in FIGS. 21, 22 and 23. In an embodiment, the thickness of the adhesive 610 of the embodiment shown in FIG. 27 may have a dimension which is in the order of magnitude of 10 μm, desirably about 10 μm.

The further transmission reduction layer 627 (which may be referred to as a second metal layer or, as explained below, a stabilizing layer) may be positioned in the surface member 600, 600' between the layer 628 of plastic material or polymer and the adhesive 610. The covering portion 620 may be secured (e.g. attached) to the adhesive 610 via the further transmission reduction layer 627. The adhesive 610 may be formed or bonded (and therefore adhered) to the covering portion.

The presence of the further transmission reduction layer 627 between the layer 628 of plastic material or polymer and the adhesive 610 in the surface member 600, 600' may be desirable during manufacture, or construction, of the surface member 600, 600'. During manufacture of the surface member 600, 600', the transmission reduction layer 629 is applied to the layer 628 of plastic material or polymer. This may be achieved, for example, by vapor deposition, for example depositing metal particles on the layer 628 of plastic material or polymer to form the transmission reduction layer 629 (which process may be referred to as metallization).

During application of the transmission reduction layer 629 to the layer 628 of plastic material or polymer, stress (for example torsional forces) may build up in and/or between the layers. For example, there may be thermal stress produced during the application of the transmission reduction layer 629 to the layer 628 of plastic material or polymer.

The layer 628 of plastic material or polymer may have sufficiently low stiffness that the typical thermal stress produced during this process (which may nevertheless only be relatively small thermal stress) can cause deformation (for example twisting and/or bending) of the layer 628 of plastic material or polymer if it is not sufficiently supported. This can lead to deformation (for example twisting and/or bending) of the entire surface member 600, 600'. Such deformation may be, for example, during manufacture. If a single transmission reduction layer 629 is applied to the layer 628 of plastic material or polymer, without sufficient support, the resulting surface member 600, 600' may be difficult to handle. For example, it may be difficult to keep the seal member 600, 600' flat (or substantially flat), as may be required for application to a surface.

The stress between the layers of the surface member 600, 600' may alternatively or additionally lead to deformation (for example twisting and/or bending) of the surface member 600, 600' during use. For example, dynamic forces exerted on the surface member 600, 600' could cause the surface member 600, 600' to deform, or could worsen any deformation already present from the manufacturing process. Such dynamic forces could be due to relative movement of the two surfaces forming the gap that the surface member 600, 600' is sealing.

The presence of the further transmission reduction layer 627 may help to reduce, if not prevent, the stress increase within the surface member 600, 600' for example between adjacent layers. The stress that would otherwise be produced during application of the transmission reduction layer 629 to the layer 628 of plastic material or polymer and/or during use may thus be reduced. Unacceptable deformation of the layer 628 of plastic material or polymer, and therefore of the covering portion 620 and the surface member 600, 600' may be avoided. As such, the further transmission reduction layer 627 may act as a support layer, or stabilizing layer, to the layer 628 of plastic material or polymer.

The further transmission reduction layer 627 may apply a force to the layer 628 of plastic material or polymer during its application to the layer 628. The force applied by the further transmission layer 627 may cause stress to build between the further transmission layer 627 and the layer 628 of plastic material or polymer. The stress (for example torsional force) induced within the covering portion 620 by the further transmission layer 627 may serve to counteract (or balance) the stress (for example torsional force) applied to the layer 628 of plastic material or polymer by the transmission reduction layer 629. Thus the further transmission layer 627 may serve to at least reduce to an acceptable level, if not prevent, the force applied by the transmission reduction layer 629 to the layer 628 of plastic material or polymer from causing deformation. The further transmission reduction layer 627 may balance internal torsion force produced by the transmission reduction layer 629 on the layer 628 of plastic material or polymer. The further transmission reduction layer 627 may be referred to as a stabilizing layer 627, for example a stabilizing metal layer 627.

The embodiment shown in FIG. 27 may be particularly appropriate in an embodiment in which the transmission reduction layer 629 is a metal layer. Such a metal layer may be formed, for example, by depositing metal ions (such as chromium ions) on the surface of the layer 628 of plastic material or polymer. Such layer may be referred to as a metallization or metalized layer. The layer may be a coating of metal, for example a film, which is deposited on the layer 628 of plastic or polymer material. Metal ion deposition can lead to a build up of stress due to inter-molecular forces. Therefore, in such an embodiment, the application of the further transmission reduction layer 627 to the opposite surface of the layer 628 of plastic material or polymer can act to balance these forces. In an embodiment, the properties (for example the dimensions, and/or materials, and/or mechanical properties) of the further transmission reduction layer 627 may be similar to, or the same as, the properties of the transmission reduction layer 629. Having a transmission reduction layer 629 and a further transmission reduction layer 627 with similar, if not the same, properties may help to ensure that the forces are balanced appropriately. Little, or no, deformation of the covering portion may be produced.

In order to manufacture a surface member 600, 600' with both a transmission reduction layer 629 and a further transmission reduction layer 627, such as that shown in FIG. 27, each transmission reduction layer may be applied in a plurality of alternating steps. In an embodiment, a fraction (for example of the thickness) of one of the transmission reduction layer 629 and the further transmission reduction layer 627 may be firstly applied to the layer 628 of plastic material or polymer. Next, a fraction of the other one of the transmission reduction layer 629 and the further transmission reduction layer 627 may be applied to the opposite surface (for example major surface) of the layer 628 of plastic material or polymer. This process, of applying a fraction of each of the transmission reduction layers 627, 629 to opposite surfaces of the layer 628 of plastic material or polymer alternately, may be repeated until both of the transmission reduction layers 627, 629 have been completely applied. Forming the transmission reduction layers 627, 629 in steps as described above may help ensure that no unacceptable torsional forces and/or distortion occurs during manufacture.

Any suitable fraction of transmission reduction layer may be applied at each step. For example, a fraction of the transmission reduction layer 627, 629 in the range of from 1% to 50% may be applied at each step. The smaller the percentage of the layer that is applied in each step, greater the number of total steps required to produce each full layer. In an embodiment, the total number of steps required to form each of the transmission reduction layers 627, 629 may be in the range of from 2 to 100 steps, for example in the range of from 3 to 50 steps, for example in the range of from 4 to 25 steps, for example in the range of from 5 to 20 steps, for example in the range of from 6 to 10 steps.

In an embodiment, the further transmission reduction layer 627, is configured (for example in terms of dimensions and materials) to reduce the transmission of UV (for example DUV) radiation. It will be appreciated that in another embodiment the further transmission reduction layer 627 does not reduce the transmission of radiation. To act as a stabilizing layer it need not be necessary for the further transmission reduction layer to reduce the transmission of UV radiation. However, it may be desirable for the further transmission reduction layer 627 to further reduce the transmission of radiation (for example UV radiation) that penetrates the covering portion 620 through to the adhesive 610. The adhesive 610 may be more susceptible to degradation through UV exposure than the layer 628 of plastic material or polymer. The further transmission reduction layer 627 may help to reduce the UV radiation from reaching the adhesive 610.

The description herein focuses on the use of the surface member 600, 600' in an immersion lithographic apparatus. However, it will be appreciated that the surface members 600, 600' described herein may be useful in other applications. For example, the surface members 600, 600' described herein may be particularly applicable as surface members which are exposed to pure water and/or UV radiation and/or high stresses and strains for example during use. In particular, the surface members 600, 600' described herein may be useful as surface members on any surface exposed to a UV source, such as solar radiation. One additional application, by way of example only, may thus be a window, such as an external window to which a lateral force may be repetitively applied.

For a surface member 600, 600' that is not exposed to DUV radiation, there is no requirement for the surface member 600, 600' to be at least DUV radiation resistant or at least opaque to DUV radiation. Thus, for example, the DUV transmission reduction layers 622, 624 (that are at least partially opaque to DUV radiation) as described herein with reference to FIGS. 21 and 22 may be omitted. In an embodiment as shown in FIG. 23, there may be no requirement to include the DUV radiation absorbing elements in the surface layer 626. Such a surface member could be used to cover a surface of a component of a lithographic tool, for an immersion system, for example to seal a gap between surfaces, that are infrequently exposed, desirably not exposed, to DUV radiation. Such a surface may be exposed to stray DUV radiation. The surface may be outside a path of radiation from the projection system to a surface facing the projection system, or may be in the path of radiation during a non-exposing phase of operation.

Figure 24:
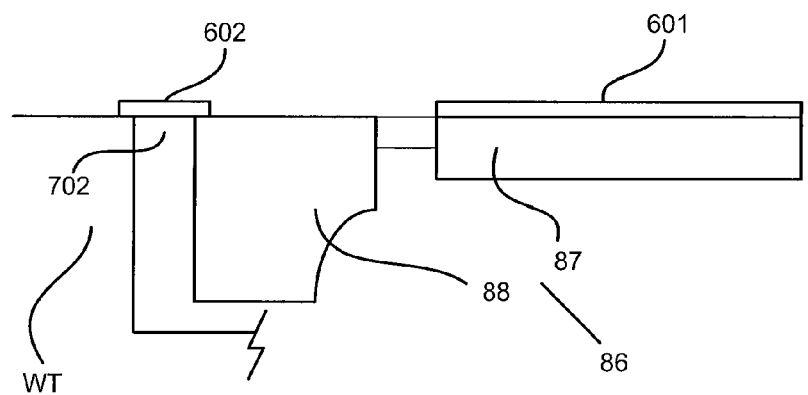
FIG. 24 depicts, in cross section, a swap bridge for engagement to a substrate table WT, indicating possible positions of a surface member.
Figure 25:
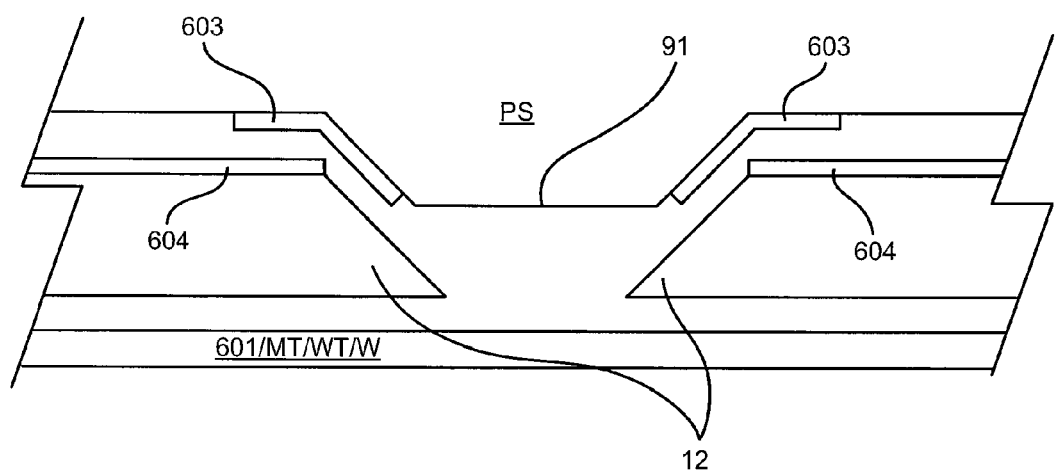
FIG. 25 depicts, in cross section, a final element of a projection system and a liquid containment structure, indicating possible positions of a surface member.

FIGS. 24 and 25 show non-limiting examples of locations that are infrequently or never exposed to DUV radiation and at which surface members 600, 600' in the form of surface members 601, 602, 603, 604 may be provided. In an immersion lithographic apparatus, it is desirable to retain the immersion liquid in place when, for example, changing a substrate. To this end, a surface of a shutter member (such as a bridge, a closing disc, or a measurement table) may replace the surface of the substrate (or substrate table) which is used to retain immersion liquid in space 11 during, e.g., substrate swap. A bridge (for example a swap bridge) may be slid underneath the projection system when a substrate (and in some cases a substrate table supporting the substrate) is removed after exposure. In an embodiment, a closing disc may be used to retain immersion liquid around the final element of the projection system, for example during substrate exchange. In an embodiment, a measurement table may be introduced underneath the projection system in place of a substrate table.

FIG. 24 shows a swap bridge 86 comprising a bridge body 87 and at least one engagement portion 88 for engaging the bridge body 87 to a substrate table WT. The engagement portion 88 may additionally or alternatively be for engaging the bridge body 87 to a closing disc, or a measurement table (which is arranged to be unable to support a substrate for exposure). A surface member 601 may be provided on a surface of the bridge body 87. Such a surface member 601 may be provided to a surface of any table shutter member. The swap bridge 86 may be arranged as shown in FIG. 24 which is an example of a removable bridge between two tables. Additionally or alternatively, a surface member 602 may be provided to cover a gap 702 between a surface of the engagement portion 88 and the substrate table WT.

FIG. 25 shows the region around the last optical element 91 of the projection system PS. A surface member 603 may be provided on a surface of the last optical element 91. A surface on which the surface member 603 may be provided may be between the last optical element 91 and a liquid confinement structure 12. So the surface member 603 may be provided on a surface that faces, in use, the liquid confinement structure 12. A surface member 604 may additionally or alternatively be provided on a surface of the liquid confinement structure 12 that faces the projection system PS, for example the last optical element 91 of the projection system PS.

As explained herein, the surface members 601, 602, 603, 604 shown in FIGS. 24 and 25 are generally infrequently, or never, exposed to DUV radiation. For example, they may be provided at positions which the beam from the projection system PS is not directed and/or doesn't pass through. However, such a surface may be exposed to stray DUV radiation. This means that they need not be resistant to DUV radiation and/or need not be opaque to DUV radiation. Note an exception may be the surface of a measurement table MRT around a sensor held by the table. Exposure radiation may be directed at the measurement table surface surrounding the sensor.

The thickness of a surface member 600, 600' (e.g. in a direction perpendicular to a major surface of the surface member 600, 600'), for example as shown in FIG. 21, 22 or 23, may be in the range of from 1 μm to 30 μm, in the range of from 2 μm to 25 μm, in the range of from 3 μm to 20 μm, in the range of from 4 μm to 15 μm, or in the range of from 5 μm to 10 μm. A surface member 600, 600' having thicknesses in one or more of these ranges above may facilitate handling and/or positioning for example by reference to the lower limit of the respective ranges. By reference to the upper limit of the range, a step height difference with respect to a surface on which the surface member is applied. The effect change in dimensions of the component to which the surface member is applied is limited, desirably minimized, so that the dimension of the component remains in the intended specified manufacturing range. For example, if the dimensions of a surface member applied to the surface of a substrate table are too large, there may be risk of collision with a liquid confinement structure as there is relative movement between the substrate table and the liquid confinement structure. By limiting the thickness of the surface member, collision risk may be reduced. However, it is possible to have a surface member 600, 600' according to an embodiment of the invention with a thickness below 1 μm, or above 30 μm.

In an embodiment, the surface member 600, 600' (which may be a sealing member 600, 600') may be provided in the form of a kit. The kit may comprise: a sealing or covering portion; and an adhesive. The sealing or covering portion may be a plastic material or polymeric sealing or covering portion. The sealing or covering portion may, by way of non-limiting example, take the form of the portion 620 shown in any one of FIGS. 21 to 23. In such a kit, the adhesive and the sealing or covering portion may be separate. The kit may be used to form a sealing member 600, 600' or surface member 600, 600', such as described herein. The adhesive in the kit may be used to adhere the sealing or covering portion to at least a part of one or more surfaces. The adhesive in the kit may be used to form, for example, an adhesive layer (such as the adhesive layer 610 shown in FIG. 11), or discrete adhesive portions (such as the portions 610a, 610b shown in FIG. 15). The kit may include a surface member 600, 600' (or the components of a surface member 600, 600') precut so they may be applied in a specific location, for example around an object such as a sensor 310, 320 held on a table WT, MRT. The kit may include a surface member 600, 600' provided as a blank for cutting shortly before applying the surface member 600, 600'.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

One or more of the controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment, there is provided a surface member for removable application to cover at least a part of at least one surface of an immersion lithographic apparatus, the member having two major orthogonal dimensions and comprising a covering portion having a first surface and a second surface and an adhesive on the second surface to attach the member to a surface of an immersion lithographic apparatus, wherein the covering portion comprises a plastic material or polymer and the covering portion is opaque to DUV radiation.

In an embodiment, there is provided a surface member for removable application to cover at least a part of a surface, the member having two major orthogonal dimensions and comprising a first metal layer, a second metal layer, a layer of plastic material or polymer positioned between the first metal layer and the second metal layer, and an adhesive on the second metal layer to attach the member to the surface.

In an embodiment, the member is for removable application to cover at least a part of at least one surface of an immersion lithographic apparatus. In an embodiment, the member further comprises a lyophobic layer on the opposite side of the first metal layer to the layer of plastic material or polymer. In an embodiment, at least one of the first metal layer and the second metal layer comprises titanium or chromium. In an embodiment, at least one of the first metal layer and the second metal layer is reflective to DUV radiation. In an embodiment, at least one of the first or second metal layer is absorptive of DUV radiation. In an embodiment, at least one of the first metal layer and the second metal layer comprises absorbing particles that absorb DUV radiation. In an embodiment, the absorbing particles comprise $TiO_2$ and/or $Ta_2O_5$. In an embodiment, at least one of the first and second metal layers is in the range of from about 25 to about 200 nm thick. In an embodiment, at least one of the first and second metal layers is in the range of from about 60 nm to about 75 nm thick.

With respect to any of the foregoing: In an embodiment, the adhesive is a layer. In an embodiment, the first surface of the covering portion is lyophobic. In an embodiment, the Young's modulus of the covering portion is less than or equal to 5 GPa. In an embodiment, the covering portion comprises a layer of plastic material or polymer, and an opaque layer that is opaque to DUV radiation. In an embodiment, the opaque layer is reflective to DUV radiation. In an embodiment, the opaque layer is a metal layer. In an embodiment, the opaque layer comprises titanium or chromium. In an embodiment, the opaque layer comprises absorbing particles that absorb DUV radiation. In an embodiment, the absorbing particles comprise $TiO_2$ and/or $Ta_2O_5$. In an embodiment, the covering portion further comprises a stabilizing layer, and the layer of plastic material or polymer is formed between the opaque layer and the stabilizing layer. In an embodiment, the adhesive is adhered to the stabilizing layer, and the layer of plastic material or polymer is on the opposite side of the stabilizing layer to the adhesive. In an embodiment, the stabilizing layer is opaque to DUV radiation. In an embodiment, the stabilizing layer is reflective to DUV radiation. In an embodiment, the stabilizing layer comprises metal. In an embodiment, the metal is at least one of titanium and chromium. In an embodiment, the stabilizing layer is absorptive of DUV radiation. In an embodiment, the stabilizing layer comprises absorbing particles that absorb DUV radiation. In an embodiment, the adhesive is adhered to the layer of plastic material or polymer, and the opaque layer is on the opposite side of the layer of plastic material or polymer to the adhesive. In an embodiment, the member comprises a lyophobic layer adjacent the opaque layer, the lyophobic layer forming the first surface of the covering portion. In an embodiment, the adhesive is adhered to the opaque layer, and the layer of plastic material or polymer is on the opposite side of the opaque layer to the adhesive, such that the layer of plastic material or polymer forms the first surface of the covering portion. In an embodiment, the layer of plastic material or polymer is lyophobic. In an embodiment, the layer of plastic material or polymer comprises a polysiloxane. In an embodiment, the layer of plastic material or polymer comprises poly(dimethylsiloxane). In an embodiment, the layer of plastic material or polymer is resistant to degradation through exposure to DUV radiation. In an embodiment, at least one of the opaque layer and the stabilizing layer is in the range of from about 25 to about 200 nm thick. In an embodiment, at least one of the opaque layer and the stabilizing layer is in the range of from about 60 to about 75 nm thick. In an embodiment, the layer of plastic material or polymer has a Young's modulus less than or equal to 5 GPa. In an embodiment, the layer of plastic material or polymer is a plastic foil. In an embodiment, the layer of plastic material or polymer comprises polyimide, PET, PTFE, polyetheretherketone, and/or polyaryletheretherketone. In an embodiment, the covering portion comprises a lyophobic layer comprising plastic or polymer material to which the adhesive adheres, the lyophobic layer comprising plastic material or polymer being opaque to DUV radiation. In an embodiment, the lyophobic layer comprising plastic material or polymer comprises a polysiloxane. In an embodiment, the lyophobic layer comprising plastic or polymer material comprises absorbing particles that absorb DUV radiation. In an embodiment, the absorbing particles comprise $TiO_2$ and/or $Ta_2O_5$. In an embodiment, the lyophobic layer comprising plastic or polymer material is reflective to DUV radiation. In an embodiment, the member is configured to cover at least a part of two surfaces and a gap therebetween, to prevent the ingress of immersion liquid into the gap. In an embodiment, the two surfaces are at least a part of a surface of a table of an immersion lithographic apparatus and at least a part of a surface of an object held on the table. In an embodiment, the object is at least one selected from the group of: a sensor, a target for a sensor, a shutter member or a substrate support. In an embodiment, the member is configured to be a patch to repair a damaged surface in an immersion lithographic apparatus. In an embodiment, the patch is arranged to be used to repair a damaged surface of at least part of at least one object selected from the group of: a table, a sensor, a shutter member, a target for a sensor, or an optical component. In an embodiment, the member is configured to be applied to a surface: with less corrosive resistance to exposure radiation, immersion liquid, or both, to provide a surface with a certain receding contact angle with respect to immersion liquid, or both. In an embodiment, the surface is a surface of at least part of at least one object selected from the group of: a sensor, a table, an optical element, a liquid confinement structure, or a shutter member. In an embodiment, the member is disposable. In an embodiment, the member is impermeable to liquid.

In an embodiment, there is provided an immersion lithographic apparatus comprising the member. In an embodiment, the immersion lithographic apparatus comprises a table, and an object positioned on the table, wherein the member is positioned to be adhered to the object and to the substrate table. In an embodiment, the object is at least one object selected from the group of: a sensor, a target for sensor, at least part of a shutter member, a cleaning station or a substrate support.

In an embodiment, there is provided a method of manufacturing a surface member, the surface member being for removable application to cover at least a part of a surface, the method comprising applying a stabilizing layer to a layer of plastic material or polymer, applying a transmission reduction layer to the plastic material or polymer layer such that the stabilizing layer and the transmission reduction layer are applied to opposite sides of the plastic material or polymer layer, and applying an adhesive to the stabilizing layer, the adhesive being applied to the opposite side of the stabilizing layer to the layer of plastic material or polymer, wherein the applying of the stabilizing layer to the layer of plastic material or polymer is performed so as to balance induced stress between the stabilizing layer and the layer of plastic material or polymer on applying the transmission reduction layer to the plastic material or polymer layer.

In an embodiment, applying the stabilizing layer and applying the transmission reduction layer to the layer of plastic material or polymer are performed by alternately applying a fraction of the stabilizing layer and a fraction of the transmission reduction layer to opposite sides of the plastic material or polymer layer. In an embodiment, applying the transmission reduction layer to the layer of plastic material or polymer and/or applying the stabilizing layer to the layer of plastic material or polymer is performed by a metal deposition process. In an embodiment, the method further comprises applying a lyophobic layer to the transmission reduction metal layer, such that the lyophobic layer is on the opposite side of the transmission reduction metal layer to the layer of plastic material or polymer.

The descriptions above are intended to be illustrative, not limiting. Thus, it will be apparent to one skilled in the art that modifications may be made to the invention as described without departing from the scope of the claims set out below.

The invention claimed is:

1. A surface member covering at least a part of a surface of an immersion lithographic apparatus, the member having two major orthogonal dimensions and comprising:
   a covering portion having a first surface and a second surface; and
   an adhesive on the second surface attaching the member to the surface of the immersion lithographic apparatus,
   wherein the covering portion comprises:
      a layer of plastic material or polymer overlying at least part of the adhesive, and
      an opaque layer that is substantially opaque to DUV radiation, the opaque layer covering at least part of the layer of plastic material or polymer,
      wherein the first surface of the covering portion is lyophobic, the lyophobic surface overlying at least part of the opaque layer, and
      wherein at least the part of the layer of plastic material or polymer and/or the adhesive deteriorates on exposure to DUV radiation, which deterioration is substantially prevented by the opaque layer covering at least the part of the layer of plastic material or polymer and/or the adhesive.

2. The member according to claim 1, wherein the opaque layer is reflective to DUV radiation.

3. The member according to claim 1, wherein the opaque layer is a metal layer.

4. The member according to claim 1, wherein the opaque layer comprises titanium or chromium.

5. The member according to claim 1, wherein the opaque layer comprises absorbing particles that absorb DUV radiation.

6. The member according to claim 1, wherein:
   the covering portion further comprises a stabilizing layer; and
   the layer of plastic material or polymer is formed between the opaque layer and the stabilizing layer.

7. The member according to claim 1, wherein:
   the adhesive is adhered to the layer of plastic material or polymer; and
   the opaque layer is on the opposite side of the layer of plastic material or polymer to the adhesive.

8. The member according to claim 1, wherein the lyophobic surface is adjacent the opaque layer.

9. The member according to claim 1, comprising a further opaque layer that is substantially opaque to DUV radiation, wherein:
   the adhesive is adhered to the further opaque layer; and
   the layer of plastic material or polymer is on the opposite side of the further opaque layer to the adhesive.

10. The member according to claim 1, wherein the layer of plastic material or polymer is a plastic foil.

11. The member according to claim 1, wherein the member is configured to cover at least a part of two surfaces and a gap therebetween, to prevent the ingress of immersion liquid into the gap.

12. The member according to claim 1, wherein the member is configured to be applied to a surface:
with less corrosive resistance to exposure radiation, immersion liquid, or both;
to provide a surface with a certain receding contact angle with respect to immersion liquid; or
both.

13. The member according to claim 1, wherein the member is impermeable to liquid.

14. An immersion lithographic apparatus comprising a member according to claim 1.

15. The member according to claim 6, wherein:
the adhesive is adhered to the stabilizing layer; and
the layer of plastic material or polymer is on the opposite side of the stabilizing layer to the adhesive.

16. The member according to claim 6, wherein the stabilizing layer is opaque to DUV radiation.

17. A surface member covering at least a part of a surface of an immersion lithographic apparatus, the member having two major orthogonal dimensions and comprising:
a covering portion having a first surface and a second surface, the covering portion comprising:
a first metal layer substantially opaque to DUV radiation,
a second metal layer, and
a layer of plastic material or polymer between the first metal layer and the second metal layer,
wherein the first surface of the covering portion is lyophobic, the lyophobic first surface overlying at least part of the first metal layer; and
an adhesive on the second surface attaching the member to the surface of the immersion lithographic apparatus,
wherein the layer of plastic material or polymer overlies at least part of the adhesive and the first metal layer overlies at least part of the layer of plastic material or polymer, and
wherein at least the part of the layer of plastic material or polymer and/or the adhesive deteriorates on exposure to DUV radiation, which deterioration is substantially prevented by the first and/or second metal layer covering at least the part of the layer of plastic material or polymer and/or the adhesive.

18. The member according to claim 17, wherein the first metal layer and the second metal layer are metallized onto the layer of plastic material or polymer.

19. A surface member for removable application to cover at least a part of a surface of an immersion lithographic apparatus, the member having two major orthogonal dimensions and comprising:
a covering portion having a first surface and a second surface; and
an adhesive on the second surface to attach the member to the surface of the immersion lithographic apparatus,
wherein the covering portion comprises:
a layer of plastic material or polymer overlying at least part of the adhesive, and
an opaque layer that is substantially opaque to DUV radiation, the opaque layer covering at least part of the layer of plastic material or polymer,
wherein the first surface of the covering portion is lyophobic, the lyophobic first surface overlying at least part of the opaque layer, and
wherein at least the part of the layer of plastic material or polymer and/or the adhesive deteriorates on exposure to DUV radiation, which deterioration is substantially prevented by the opaque layer covering at least the part of the layer of plastic material or polymer and/or the adhesive.

20. The member according to claim 19, wherein the covering portion further comprises a metal layer between the layer of plastic material or polymer and the adhesive and the opaque layer and the metal layer are metallized onto the layer of plastic material or polymer.

* * * * *